(12) United States Patent
Matsui et al.

(10) Patent No.: US 6,555,429 B2
(45) Date of Patent: Apr. 29, 2003

(54) METHOD OF MANUFACTURING SEMICONDUCTOR DEVICES UTILIZING UNDERLAYER-DEPENDENCY OF DEPOSITION OF CAPACITOR ELECTRODE FILM, AND SEMICONDUCTOR DEVICE

(75) Inventors: Yuichi Matsui, Kokubunji (JP); Masahiko Hiratani, Akishima (JP); Yasuhiro Shimamoto, Hachioji (JP); Yoshitaka Nakamura, Ome (JP); Toshihide Nabatame, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 137 days.

(21) Appl. No.: 09/810,627

(22) Filed: Mar. 19, 2001

(65) Prior Publication Data

US 2001/0026988 A1 Oct. 4, 2001

Related U.S. Application Data

(63) Continuation of application No. 09/767,706, filed on Jan. 24, 2001.

(30) Foreign Application Priority Data

Jan. 26, 2000 (JP) ........................................ 2000-021758

(51) Int. Cl.[7] ........................................... H01L 21/8242
(52) U.S. Cl. ....................... 438/241; 438/239; 438/253; 438/256; 438/396
(58) Field of Search ................................ 438/241, 240, 438/239, 253, 256, 254, 396, 399

(56) References Cited

U.S. PATENT DOCUMENTS 6,211,035 B1 * 4/2001 Moise et al. ................ 438/396
6,225,227 B1 * 5/2001 Aizawa ....................... 438/694
6,239,461 B1 * 5/2001 Lee ............................. 257/306
6,265,262 B1 * 7/2001 Okuno et al. ............... 438/239
6,294,425 B1 * 9/2001 Hideki ........................ 438/253

OTHER PUBLICATIONS

Kim, Jin–Won et al, "Development of Ru/Ta2O3/Ru Capacitor Technology for Giga–scale DRAMs," Technical Digest of International Electron Devices and Materials (IEDM), 1999, pp. 793–796.
Hieda, K. et al, "Low Temperature (Ba,Sr) TiO3 Capacitor Process Integration (LTB) Technology for Gigabit Scaled DRAMs," Technical Digest of International Electron Devices and Materials (IEDM), 1999, pp. 789–792.
Ono, K. et al, "(Ba,Sr) TiO3 Capacitor Technology for Gbit–Scale DRAMs," Technical Digest of International Electron Devices and Materials (IEDM), 1998, pp. 803–806.

* cited by examiner

*Primary Examiner*—Michael Trinh
(74) *Attorney, Agent, or Firm*—Mattingly, Stanger & Malur, P.C.

(57) ABSTRACT

In a semiconductor device including a plurality of memory cells, a deposition preventing film is formed on an interlayer insulating film in which a plurality of holes are formed, or a seed film is selectively formed on the interlayer insulating film and on an inner surface and a bottom surface of the holes. A film of Ru, Ir or Pt is deposited by chemical vapor deposition on the deposition preventing film, or on the interlayer insulating film by utilizing the seed film, under the condition where underlayer dependency occurs. In consequence, lower electrodes are formed in accordance with a pattern of the deposition preventing film or the seed film. A dielectric film is formed on the lower electrodes and the deposition preventing film at a predetermined temperature. The material of the lower electrodes does not lose conduction even when exposed to the predetermined temperature employed for forming the dielectric film. Upper electrodes are further formed on the dielectric film. The upper and lower electrodes and an oxide dielectric film together constitute capacitors of the memory cells.

6 Claims, 15 Drawing Sheets

METHOD OF MANUFACTURING SEMICONDUCTOR DEVICES UTILIZING UNDERLAYER-DEPENDENCY OF DEPOSITION OF CAPACITOR ELECTRODE FILM, AND SEMICONDUCTOR DEVICE

This application is a continuation application of U.S. Ser. No. 09/767,706, filed Jan. 24, 2001, allowed.

BACKGROUND OF THE INVENTION

This invention relates to a semiconductor device of the type in which an electrode of a capacitor or a plug of each memory cell is formed by chemical vapor deposition, and to a method of manufacturing the semiconductor device.

High integration density of semiconductor devices such as dynamic random access memories (DRAMs) can be achieved when a cell area is reduced. This means that an occupying area of the capacitor of the memory cell decreases inevitably. Nonetheless, predetermined storage capacitance necessary for reading out the memory must be secured to prevent a soft error. In other words, means is necessary for increasing storage capacitance per unit area to attain a high integration density of semiconductor devices. One of such means would be the one that applies an oxide dielectric material having a large specific dielectric constant to a capacitor insulating film. A $Ta_2O_5$ film (specific dielectric constant: 20 to 25) has been used at present for the capacitor insulating film in place of a $SiO_2$ film (specific dielectric constant: 3.8) and a $Si_3N_4$ film (specific dielectric constant: 7 to 8) that have been used in conventional memories. In memories of a giga-bit scale, however, storage capacitance necessary for readout is not sufficient even when the $Ta_2O_5$ film having a large specific dielectric constant is used and capacitors have a three-dimensional structure to increase a substantial capacitor area. Therefore, oxide dielectric materials having a specific dielectric constant of 100 or more, such as strontium titanate: $SrTiO_3$ (STO), Barium Strontium Titanate: $(Ba,Sr)TiO_3$ (BST), lead zircotitanate: $Pb(Zr, Ti)_3$ (PZT) and $SrBi_2Ta_2O_9$ (SBT), have been examined for a capacitor dielectric film. PZT and SBT among them can be applied to ferroelectric memories that utilize their ferroelectricity.

To improve electric property (dielectric property), these oxide dielectric materials require film formation and post heat-treatment at a high temperature of at least 400° C. to 700° C. in an oxidizing atmosphere. In this instance, when a lower electrode is oxidized by oxygen contained in the atmosphere, an insulating film having a lower dielectric constant than that of a capacitor insulating film is formed, inviting the substantial drop of capacitance of the capacitor. When a barrier layer and plugs positioned below the lower electrode are oxidized, electric conduction is lost between the transistor and the capacitor. Therefore, platinum (Pt) that is relatively stable in a high-temperature oxidizing atmosphere and ruthenium (Ru) and iridium (Ir) that keep conduction even when oxides are formed have been examined as promising materials of the lower electrode. Most preferred among them is Ru as the lower electrode of the oxide dielectric material because it has high fine etching property.

To sum up, storage capacitance necessary for readout might be insufficient in giga-bit scale memory cells even when an oxide dielectric material having a high specific dielectric constant is used because the area the capacitor can occupy is small. To substantially increase the capacitor area, therefore, the capacitor structure must be rendered three-dimentional. For example, process steps are necessary to shape the lower electrode of the capacitor into a three-dimentional structure and then to form the oxide dielectric material of the capacitor, or to shape the lower electrode on the three-dimentional structure that is formed in advance, and then to form the oxide dielectric material.

The article entitled "(Ba, Sr)$TiO_3$ Capacitor Technology for Gigabit Scaled DRAMs" in "Technical Digest of International Electron Devices and Materials (IEDM)", 98, pp. 803–806, describes an example of a three-dimentional structure of a capacitor that uses BST as the material of a dielectric film, shapes electrodes into a convex shape and uses Ru as the material of the electrodes.

The article entitled "Low Temperature (Ba, Sr)$TiO_3$ Capacitor Process Integration (LTB) Technology for Gigabit Scaled DRAMs" in "Technical Digest of International Electron Devices and Materials (IEDM)", 99, pp. 789–792 describes an example of a three-dimentional structure of a capacitor that uses BST as a material of a dielectric film, shapes electrodes into a concave shape and uses $SrRuO_3$ as the material of the electrodes.

Furthermore, the article entitled "Development of Ru/$Ta_2O_5$/Ru Capacitor Technology for Gigabit Scale DRAMs" in "Technical Digest of International Electron Devices and Materials (IEDM)", 99. pp. 793–796 teaches to sputter and etch away unnecessary Ru in a formation step of a lower electrode of a capacitor made of Ru.

However, none of the references cited above recognize the following problems. In other words, these references do not teach or suggest at all the technical features of the present invention that will be explained below in detail.

SUMMARY OF THE INVENTION

Studies conducted by the inventors of the present invention have revealed that the following problems develop when a capacitor having a three-dimentional structure is fabricated by using the prior art technologies described above.

The three-dimentional structure of the lower electrode fabricated and examined by way of experiment by the present inventors will be explained with reference to FIGS. 1a to 1c. All the drawings depict the section. First, a Ru lower electrode film 5' having a film thickness of 400 nm is deposited on plugs 1 made of Ru and a plug interlayer insulating film 2 made of $SiO_2$, for example (FIG. 1a). The lower ruthenium electrode film 5' is then etched into a cylinder shape, an elliptic cylinder shape or a rectangular shape to the surface of the plug interlayer insulating film 2 by known photolithography and dry etching, giving lower electrodes 5 having a three-dimentional structure (FIG. 1b). In a giga-bit scale semiconductor device having a minimum feature size of not greater than 0.15 μm, however, it is difficult to vertically etch the ruthenium electrode having the shape described above. Therefore, the etching shape becomes such that bottom portion becomes wider than the top portion as shown in FIG. 1b. After the lower ruthenium electrode 5 is etched, an oxide dielectric material 6 made of BST, for example, is deposited by chemical vapor deposition (CVD). An upper electrode 7 made of Ru, for example, is then deposited by CVD, completing the capacitor (FIG. 1c). In this case, since the bottom portion of the lower electrode has a wide patterning shape as described above, the adjacent capacitors are so close to each other that electric interaction occurs between them. When a sufficient gap is secured between the bottom portions of the electrodes, a sufficient area of the top surface cannot be secured, on the contrary, and the sectional shape of the electrode becomes triangular with the result that the surface area of the three-dimentional electrode decreases.

Another structural example of a three-dimentional structure fabricated and examined by the present inventors by way of experiment, in which holes are formed into a silicon oxide film, fine patterning of which is easy, from the film surface, and a Ru lower electrode is then deposited by CVD, will be explained with reference to FIGS. 2a to 2c. All the drawings show the section. First, a 400 nm-thick capacitor interlayer insulating film 3 made of $SiO_2$, for example, is deposited by CVD on plugs 1 made of Ru and a plug interlayer insulating film 2 made of $SiO_2$, for example. Holes reaching the surface of the plug interlayer insulating film 2 are then formed in the capacitor interlayer insulating film 3 into a cylinder shape, an elliptic cylinder shape or a rectangular shape, by known photolithography and dry etching. Lower ruthenium electrodes 5' having a film thickness of 30 nm are thereafter deposited by CVD, giving the lower electrodes having the three-dimentional structure (FIG. 2a). However, it is necessary in this case to remove the portion of the lower electrode 5' deposited on the top surface of the capacitor interlayer insulating film 3 and to electrically isolate adjacent capacitors from one another. According to a physical sputter-etching process that is generally employed to remove the film in self-alignment, the electrodes deposited on the top surface of the interlayer insulating film can be removed preferentially, but the portion to be utilized as the lower electrode is simultaneously exposed to the etching atmosphere. In consequence, the film thickness decreases on the side wall portion of the cylinder near the top surface and on the bottom portion near the center, and the lower electrode 5 has concretely the shape as shown in FIG. 1b. The oxide dielectric material 6 made of BST, for example, is then deposited by CVD and the upper electrode 7 made of Ru, for example, is likewise deposited by CVD, completing the capacitor portion (FIG. 1c).

This process invites the problems that the capacitor area decreases due to the drop of the height of the sidewall portion and the capacitor resistance increases due to the decrease of the film thickness of the lower electrode. Therefore, a method of electrically isolating the adjacent capacitors is preferred that does not include the step of sputtering and etching away a part of the lower electrode.

According to one aspect of the present invention, a first electrode of a capacitor electrically connected to one of a pair of active regions of a transistor in each memory cell is formed by the steps of forming a deposition preventing film on an insulating film in such a manner as to define a desired pattern of the first electrode of the capacitor and forming a film of a first conductive material to the pattern defined by the deposition preventing film. Next, a dielectric film is formed at a predetermined temperature on the film of the first conductive material and on the deposition preventing film, or on the film of the first conductive material and on the insulating film by removing the deposition preventing film. At this time, the material of the first conductive material is Ru, Pt or Ir that does not lose conduction even when exposed to the predetermined temperature for forming the dielectric film. Next, a second conductor layer that serves as a second electrode of the capacitor is formed on the dielectric film.

According to another aspect of the present invention, a first electrode of a capacitor electrically connected to one of a pair of active regions of a transistor in each memory cell is formed by the steps of forming a seed film on an inner surface and a bottom surface of holes formed in an insulating film, or further on the insulating film, whenever necessary, in accordance with a desired pattern of the first electrode of the capacitor, and forming a film of a first conductive material into the desired pattern by utilizing the seed film. Next, a dielectric film is formed at a predetermined temperature on the film of the first conductive material and on the insulating film. At this time, the material of the first conductive film is Ru, Pt or Ir that does not lose conduction even when exposed to the predetermined temperature for forming the dielectric film. A second conductor layer serving as a second electrode of the capacitor is formed on the dielectric film.

According to still another aspect of the present invention, holes are formed in an interlayer insulating film in a semiconductor device including a plurality of memory cells, and a lower electrode is selectively deposited on a side surface or an inner surface and a bottom surface of each hole when the lower electrode of a capacitor of each memory cell is deposited by chemical vapor deposition (CVD) on an inner side wall of each hole. Since the lower electrodes between adjacent capacitors are not electrically connected in this case, a process step of physically sputtering and etching away the electrode deposited on the top surface of an interlayer insulating film, that has been necessary in the prior art technologies, can be omitted, and the problem of undesired etching of the portion necessary as the lower electrode during this step can be solved, too. In addition, even when the lower electrode material such as Ru is deposited to the top surface of the interlayer insulating film, the step of removing the film on the top surface of the insulating film can be simplified and the process time can be shortened provided that the film thickness of the lower electrode material on the interlayer insulating film can be made sufficiently smaller by selective growth to the inner surface of the holes than the thickness of the film formed by the lower electrode material deposited to the inner surface of the holes. Incidentally, the material of the dielectric film of the capacitor is not limited to oxides, and dielectric materials made of nitrides may be used, too.

DETAILED DESCRIPTION OF THE EMBODIMENTS

The observation as the basis of the present invention the present inventors have acquired as a result of studies and examination will be described prior to the explanation of the embodiments of the present invention.

The present inventors have found the condition where deposition of a Ru film onto an underlayer film becomes selective depending on a material and a growing temperature of the underlayer film in chemical vapor deposition. It is possible by utilizing this underlayer film-dependency to form a capacitor of a fine memory cell having an increased storage capacity. The explanation will be given on the following items, for example.

(1) formation method of a non-selective layer, that is, a deposition preventing film, made of TiN, and its function;

(2) formation of a thin film Ru electrode of a capacitor using the deposition preventing film as a capacitor interlayer insulating layer;

(3) formation of Ru plugs of a capacitor using the deposition preventing film as capacitor interlayer insuating layer;

(4) formation of a buried Ru electrode using the deposition preventing film as plug interlayer insulating layer;

(5) function of a ultra-thin Ru film, as a selecting layer, that is, a seed layer;

(6) buried Ru electrodes using the ultra-thin Ru film as the seed layer;

(7) thin film Ru electrodes using the ultra-thin Ru film as the seed layer;

(8) Ru plug using the ultra-thin Ru film as the seed layer;

(9) formation of the seed layer by CVD and formation of electrodes on the seed layer formed by CVD;

(10) formation of electrodes using both deposition preventing film and seed layer formed by CVD;

(11) desirable electrode formation condition for increasing the effect of the Ru seed layer;

(12) formation of an upper Ru electrode by forming the seed layer on a dielectric film; and

(13) limitation of CVD to film formation condition.

First, formation of a non-selective layer made of TiN, for example, that is, a deposition preventing film, and its function, will be described.

Figure 3A:
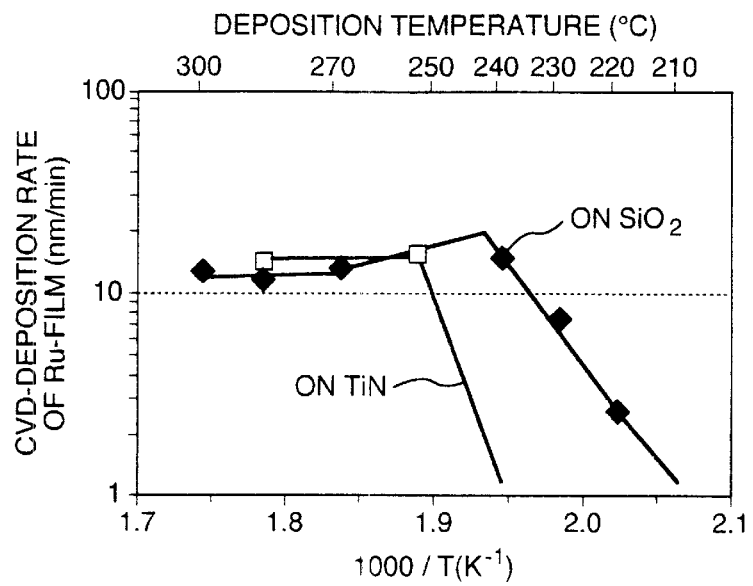
FIGS. 3a to 3c are diagrams each showing underlayer film-dependency of a deposition rate of a Ru film clarified by the inventors of the present invention.
Figure 3B:
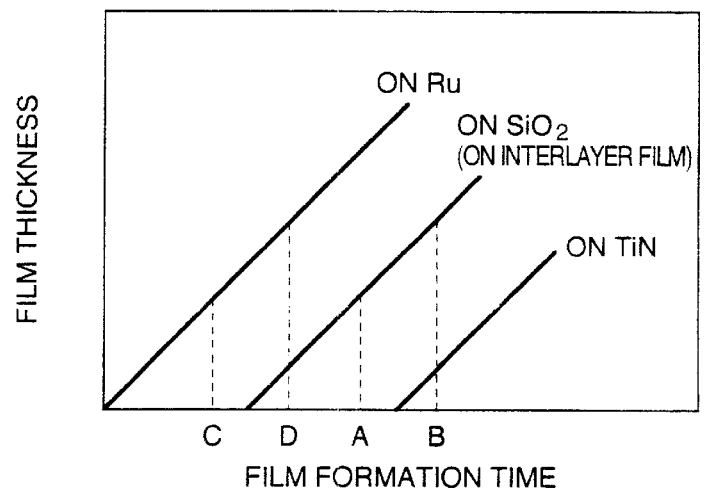
Figure 3C:
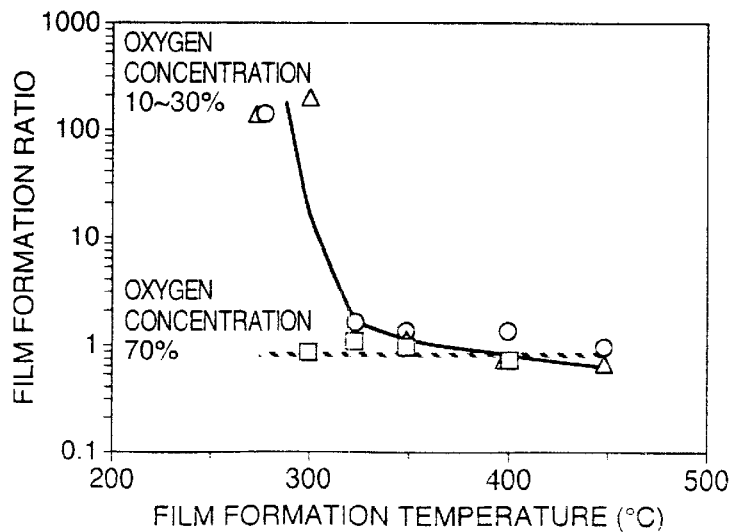

The explanation will be given concretely with reference to FIGS. 3a to 3c. FIG. 3a shows underlayer film-dependency of a deposition rate of a Ru film formed by chemical vapor deposition (CVD). Concrete film formation conditions other than those described hereby will be explained afterwards in the later-appearing embodiments of the present invention. The deposition rate of the Ru film on a $SiO_2$ film increases with the increase of a deposition temperature within the range of 220° to 240° C. Deposition of the Ru film is reaction-limited (or is determined by the reaction rate) within this temperature range. On the other hand, the Ru film is not deposited on a TiN film to a deposition temperature of up to about 255° C. In other words, when the deposition temperature is set to at least between 220° and 255° C. under the deposition condition of this experiment, deposition of the Ru film becomes selective to the underlayer film. Therefore, the Ru film is formed on the $SiO_2$ film but is not formed on the TiN film. This phenomenon can be explained by using a so-called "incubation time" which can be observed in the initial formation process of the film by CVD and during which the film is not easily formed on the substrate. This will be explained with reference to FIG. 3b.

The abscissa represents the lapse of the film formation time and the ordinate does a film thickness of the film formed. This incubation time is longer on the TiN film than on the $SiO_2$ film. In other words, when this difference of the incubation time is utilized, the Ru film is not formed on the TiN but can be selectively formed on the $SiO_2$ film at a point A in FIG. 3b, for example.

Next, formation of a thin film Ru electrode using the deposition preventing film as a capacitor interlayer insulating layer will be explained.

Figure 2A:
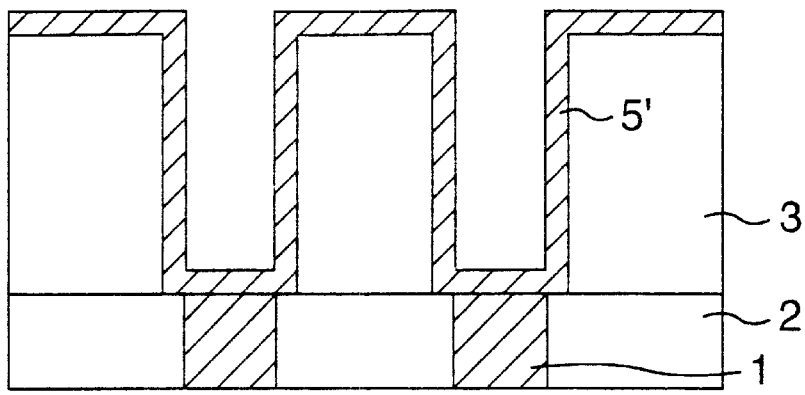
FIGS. 2a to 2c are sectional views each showing a manufacturing step of another structure fabricated and examined by the inventors of the present invention by way of experiment.
Figure 2B:
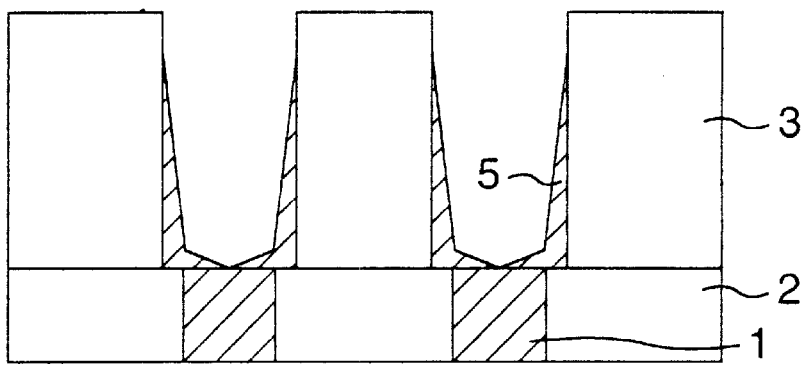
Figure 2C:
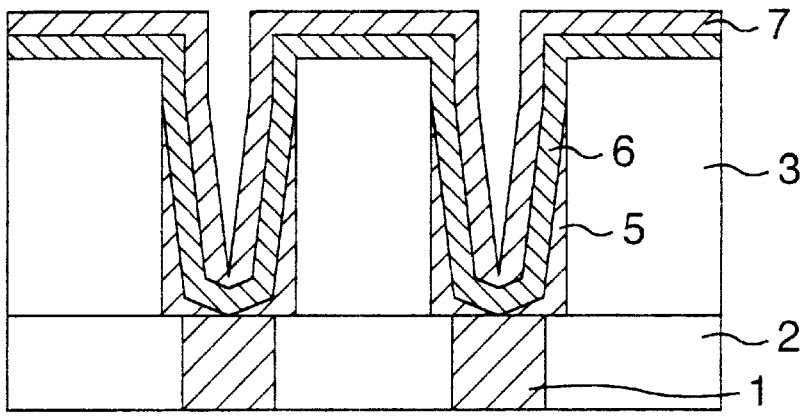

When the deposition preventing film of the TiN film, for example, is formed in advance in the region to which deposition of the Ru electrode is not desired, the Ru electrode can be deposited to only a desired region. The region to which deposition of the Ru electrode is not desired is, for example, the flat part of the top surface of the interlayer insulating film as explained already with reference to FIG. 2, for example. The deposition preventing film can be formed in self-alignment by the steps of depositing the TiN film on the interlayer insulating film after its deposition, forming a hole in the interlayer insulating film and simultaneously forming the hole in the TiN film, too. Thereafter, the Ru film is deposited to a film thickness of about 20 nm to about 50 nm at a deposition temperature at which the Ru film becomes selective to the underlayer film. According to this process, the Ru film is deposited to only the side surface, the inner surface and the bottom of the hole formed in the interlayer insulating film. Therefore, the process step of physically sputtering and etching away the electrode on the upper surface of the interlayer insulating film, that has been necessary in the prior art technologies, can be omitted, and the problem that the necessary portions are etched away during this process can be solved, too.

Since the TiN film is electrically conductive, however, electric isolation between the capacitors as the original object of the invention is not yet accomplished. Therefore, the TiN is oxidized and rendered non-conductive after deposition of the Ru film, for example. Even when the Ru film is oxidized, too, during this process and turns to $RuO_2$, only the deposition film can be insulated because the $RuO_2$ film is conductive. However, because the Ru film expands more than double in volume due to oxidation, breakage of the shape of the lower electrode may occur. It is therefore preferred to render only the TiN film non-conductive without oxidizing the Ru film.

TiN has a greater absolute value of oxidation free energy than Ru. When an appropriate oxidation condition is selected, therefore, only the TiN film can be oxidized and rendered non-conductive without oxidizing the Ru film.

For the reason described above, it is preferred to use a material having a greater absolute value of oxidation free energy for the deposition preventing film to Ru. Concrete example includes Ti, W, Ta and WN film besides the TiN film, and similar effects can be obtained. When a non-conductive material is used in advance for the deposition preventing film, the step of oxidizing the deposition preventing film to insulate it can be omitted. Concretely, it is possible of use Ti oxides, W oxides and Ta oxides. Electric insulation between the capacitors can be also achieved by dry etching or wet etching the deposition preventing film after the lower electrode is deposited. A capacitor having a desired three-dimentional structure can be fabricated by serially depositing a dielectric material of a BST film and an upper electrode of a Ru film, for example, after the process steps described above. When the deposition preventing film is removed, a structure is formed in which the interlayer insulating film and the dielectric material keep direct contact with each other without permitting the existence of an isolating layer on the top surface of the capacitor interlayer insulating film.

Next, formation of the Ru plug of the capacitor using the deposition preventing film as the plug interlayer insulating layer will be explained.

The Ru plug can be formed easily by a burying method when the selective growth of the Ru film by CVD is utilized. First, the deposition preventing film is formed on the upper surface of the plug interlayer insulating film at which burying of the Ru film is not desired. Next, plug holes are formed in the region of the interlayer insulating film not covered with the deposition preventing film. The Ru film is then deposited selectively by CVD, giving the desired plug holes having the Ru film buried to only the inside. The Ru plugs can be formed in this way. The plug surface is preferably planarized thereafter by chemical mechanical polishing (CMP). In this instance, the deposition preventing film can be utilized as a stopper to polishing. After the plugs are formed, the deposition preventing film may be selectively oxidized and rendered non-conductive, or may be removed in the same way as in the case of the formation of the lower electrode.

Next, a buried Ru electrode of a capacitor using the deposition preventing film as an capacitor interlayer insulating layer will be explained.

When the selective growth of the Ru film by CVD described above is utilized, a buried type upstanding or pedestal-shaped lower Ru electrode can be easily formed. A concrete process is as follows. The deposition preventing film of a TiN film, for example, is formed in advance in regions other than the region to which the Ru electrode is to be buried, in the same way as in the formation of the plugs described above. The Ru electrode can be deposited to only the desired region, and can be thus buried. The regions other the region in which the Ru electrode is desired to be buried represent, for example, the flat part of the top surface of the interlayer insulating film where the holes are formed. After the interlayer insulating film is deposited, a TiN film, for example, is deposited on the interlayer insulating film and holes are formed in the interlayer insulating film into an etching shape such that the shape is cylindrical, elliptic or rectangular, for example. If the holes are formed simultaneously in the TiN film at this time, the deposition preventing film can be formed in self-alignment. The Ru film is then deposited under the selective condition to the underlayer film, that is, for the formation time A shown in FIG. 3b. According to this process, the Ru film is deposited to only the side surface (inner surface) and the bottom surface of each hole formed in the interlayer insulating film. Consequently, the Ru film can bury the holes. When the interlayer insulating film is thereafter removed, the upstanding or pedestal-shaped lower Ru electrode can be achieved.

Alternatively, it is permissible to deposit the Ru film on the deposition preventing film of the TiN film that is disposed in advance in the regions of the interlayer insulating film where the burying of the Ru electrode is not desired. In other words, when the formation of the Ru film is continued till the time B longer than the time A in FIG. 3b, that is, the time exceeding the incubation time on the TiN film, the Ru film is formed on the TiN film, too. However, the film thickness of the Ru film on the deposition preventing film is sufficiently smaller than the film thickness of the Ru film formed on the side and bottom surfaces of the holes inside the interlayer insulating film. Therefore, the Ru film on the deposition preventing film does not close the hole, and the Ru film can be deposited to the side (inner) and bottom surfaces of the holes formed in the interlayer insulating film. In addition, since the film thickness of the Ru film on the deposition preventing film is small, the Ru film can be removed within a relatively short time when it is removed by polishing, or the like. Subsequently, the interlayer insulating film around the Ru electrode so buried is removed, and the upstanding or pedestal-shaped lower Ru electrode can be accomplished. To prevent deformation of the Ru electrode by post heat-treatment, it is preferred to heat-treat and densify the buried Ru electrode before the interlayer insulating film is removed.

A material having a greater absolute value of oxidation free energy than Ru may be used for the deposition preventing film. More concretely, similar effects can be obtained by using Ti, W, Ta and WN films and oxides of Ti, W and Ta besides the TiN film. After these steps, a dielectric material consisting of a BST film, for example, and an upper electrode consisting of a Ru film, for example, are serially deposited, giving a desired upstanding or pedestal-shaped three-dimentional structure capacitor.

Next, the function of the selective layer of the ultra-thin Ru film, that is, as the seed layer, will be explained.

A method of forming an electrode on the Ru film by utilizing selective growth in CVD will be explained with reference to FIG. 3b. When the Ru film is formed on the Ru film by CVD, the incubation time can be extinguished. In other words, when the film formation is stopped at the time C in FIG. 3b, it is possible to select the selective condition where the Ru film is not deposited on the SiO$_2$ film but can be deposited on only the Ru film. The explanation will be given with reference to a more concrete condition. It can be appreciated from FIG. 3a that the Ru film is not deposited on the SiO$_2$ film till the deposition temperature of about 220° C. but is deposited on the Ru film. In other words, when the deposition temperature is set to 210° C., for example, under the deposition condition of this experiment, deposition of the Ru film becomes selective to the SiO$_2$ film, that is, the underlayer film. When this selectivity to the underlayer film is utilized, the plug and the upstanding or pedestal-shaped lower Ru electrode can be easily accomplished by the burying method.

First, formation of the buried type upstanding or pedestal-shaped lower Ru electrode using the ultra-thin Ru film as the seed layer will be explained.

A thin Ru film is formed in advance in the region where deposition of the Ru electrode is desired, and the Ru electrode can be buried in the desired region. The region where burying of the Ru electrode is desired represents the side surface (inner surface) and the bottom surface of the holes formed in the interlayer insulating film, for example. The holes are formed in the interlayer insulating film and the Ru film is deposited to the whole surface of the resulting structure by sputtering, for example. This is called the seed layer (seed film). Because the Ru film seed layer can be formed on the inner surface of the holes by sputtering, CVD may seem unnecessary, but CVD is essentially necessary. For, none of planarity, uniformity and step coverage, that are required for the electrodes formed by CVD, are not required for the seed layer. Even a non-continuous film having a thickness of about 1 nm, for example, can sufficiently function as the seed layer. Therefore, the seed layer may be thin, and formation itself of a thinner film is difficult. When a non-continuous film is permitted, the seed layer can be formed sufficiently by using a film formation method having lower step coverage such as sputtering. After the seed layer is formed, the Ru seed layer deposited to the top surface of the interlayer insulating film is removed by CMP (chemical mechanical polishing). In this instance, since the seed layer is thin, it can be removed within a short time. Alternatively, the seed layer may be removed by a sputter-etching process provided that the seed layer on the inner surface of the holes is not completely removed. Thereafter, the Ru film is deposited by CVD under the condition where selectivity to the underlayer film is established. According to this process, the Ru film can bury the holes because the Ru film is deposited to only the side surface (inner surface) and the bottom portion of the interlayer insulating film.

Alternatively, the Ru film may be deposited to the top surface of the interlayer insulating film. In other words, when the Ru film is formed for a time D longer than the time C in FIG. 3b, that is, the time exceeding the incubation time, the Ru film is formed on the interlayer insulating film, too. However, the film thickness of the Ru film on the interlayer insulating film is sufficiently smaller than the film thickness of the Ru film formed on the side surface (inner surface) and the bottom surface of the seed layer, and Ru film does not close the holes. In this way, the Ru film can be deposited to the side surface (inner surface) and the bottom surface of the holes formed in the interlayer insulating film. Since the Ru film formed on the interlayer insulating film is sufficiently smaller than the Ru film on the seed layer, it can be removed within a short time by polishing, or the like. Thereafter, the interlayer insulating film round the buried Ru electrode is removed, and the upstanding or pedestal-shaped lower Ru electrode can be accomplished. To prevent deformation of the Ru electrode due to the post-heat treatment, it is preferred to heat-treat and densify the Ru electrode before the interlayer insulating film is removed. When a dielectric consisting of a BST film, for example, and an upper electrode consisting of a Ru film, for example, are serially deposited after these process steps, a desired upstanding or pedestal-shaped three-dimentional structure capacitor can be formed.

Needless to say, the method using the ultra-thin Ru film as the seed layer can be applied not only to the formation of the buried electrode but also to the formation of the thin film Ru electrode.

In other words, this method can be applied to a capacitor structure for forming an electrode having a thickness of about 20 to about 50 nm on the seed layer. Because the seed layer is used, the increase of the film thickness is proportional to the film formation time while passing through the origin as shown in FIG. 3b, and the film thickness can be controlled with higher accuracy. The method till the formation of the seed layer is the same as the method of forming the upstanding or pedestal-shaped electrode by burying. When the Ru film is formed selectively by CVD on the seed layer to a film thickness of about 20 to about 50 nm by selecting the film formation time C in FIG. 3b, the Ru film is not formed on the interlayer insulating film with the result that the capacitors are electrically isolated from one another. When a dielectric material consisting of a BST film, for example, and a top electrode consisting of a Ru film, for example, are serially deposited to the lower electrode so formed, a three-dimentional structure capacitor having a desired thin film Ru electrode can be formed.

Next, formation of a Ru plug using a ultra-thin Ru film as the seed layer will be explained briefly. A buried type Ru plug is formed through the selective growth of the Ru film on the Ru film. The seed layer of a ultra-thin Ru film is formed in advance on the inner surface of a plug hole formed in a desired region of an insulating film in exactly the same way as the formation method of the lower electrode. When Ru is buried into each plug hole, the Ru plug can be obtained. Thereafter, the surface of each plug is preferably planarized by CMP.

A method of forming the seed layer by using CVD will be explained because uniformity and continuity are not required for the seed layer to the extent as required for the electrode.

Not only sputtering described above but also CVD can be employed to form the Ru film as the seed layer for selectively forming the Ru film. More concretely, each hole having a cylindrical, elliptically cylindrical or rectangular shape is first formed in the interlayer insulating film. Next, the seed layer of the Ru film is deposited to the surface of the insulating film by CVD. The Ru film deposited to the top surface of the interlayer insulating film is removed by CMP, or by a sputter-etching process so long as the seed layer does not disappear completely in the latter case. Here, the Ru film is once heat-treated and densified so that the seed layer can effectively function as a more metallic seed layer. The Ru film is deposited by CVD to this seed layer under the selective condition. The detail of the following procedures is the same as when the seed layer is formed by sputtering as described above. As a result of series of process steps, the Ru film is deposited to only the side surface (inner surface) and the bottom surface of the holes formed in the interlayer insulating film. In consequence, an upstanding or pedestal-shaped lower Ru electrode, that buries the hole by the Ru film, and a thin film Ru electrode having a film thickness of about 20 to about 50 nm, can be formed.

Next, formation of an electrode using both deposition preventing film and seed layer formed by CVD will be explained.

When CVD is used for forming the seed layer, the process step of removing the Ru film formed on the interlayer insulating film can be omitted by combining the seed layer with the deposition preventing film. First, the deposition preventing film consisting of a TiN film, for example, is formed in advance in a region where deposition of the Ru electrode as the seed layer is not desired, and the Ru electrode can be deposited to only the desired region. The region where deposition of the Ru electrode is not desired represents the flat part of the top surface of the interlayer insulating film in which the holes are formed, for example. After deposition of the interlayer insulating film, the TiN film is deposited on the interlayer insulating film, and an electrode hole or a plug hole is formed in the interlayer insulating film. At the same time, the hole is formed inside the TiN film, too, and in this way the deposition preventing film can be formed in self-alignment. The Ru film of the seed layer is preferably densified by heat-treatment. This is for forming the more metallic seed layer as described already. The Ru film is thereafter deposited by CVD under the selective condition to the underlayer film.

According to this process, the Ru film is deposited to only the side surface (inner surface) and the bottom surface of the hole formed in the interlayer insulating film. The form of the Ru electrode to be formed may be a buried type upstanding or pedestal-shaped electrode or a thin film electrode having a thickness of 20 to 50 nm. In the case of the buried type upstanding electrode or the plug, the Ru film is deposited in this process to only the side surface (inner surface) and the bottom surface of the interlayer insulating film. Therefore, Ru can bury the hole.

The Ru film may of course be deposited to the top surface of the interlayer insulating film having the holes. In this case, a step of removing the Ru film deposited on the top surface of the interlayer insulating film by sputtering or CMP is added. Finally, the interlayer insulating film round the buried Ru is removed, and the upstanding or pedestal-shaped lower Ru electrode or the Ru plug can be accomplished. To prevent deformation of the Ru electrode by the post heat-treatment, the interlayer insulating film is preferably densified by heat-treatment before it is removed. After these steps, a dielectric material consisting of a BST film, for example, and an upper electrode consisting of a Ru film, for example, are serially deposited, giving a desired upstanding or pedestal-shaped three-dimentional structure capacitor.

Next, the explanation will be given on a desirable electrode formation condition to increase the effect of the Ru seed layer when the Ru electrode is formed by CVD. Here, the present invention utilizes the phenomenon in which the formation of the Ru film on the seed layer by CVD becomes more remarkable at a lower temperature.

The explanation will be given with reference to FIG. 3c. The abscissa represents the film formation temperature by CVD and the ordinate does a ratio of a formation rate of the Ru film formed on the Ru film to a formation rate of the Ru film formed on a $SiO_2$ film (film formation ratio). A remarkable increase of the film formation rate on the seed layer can be observed at a deposition temperature lower than 300° C. when an oxygen concentration in an atmosphere during the film formation is 10 to 30%. When the oxygen concentration is 70%, on the other hand, the increase of the film formation rate on the seed layer cannot be observed even when the deposition temperature changes. Therefore, when the Ru lower electrode, the Ru lower buried electrode and the Ru plug are formed by the selective growth onto the Ru film, the oxygen concentration is preferably lower than 70%. The lower limit of the oxygen concentration is preferably at least 0.01% that is necessary for the decomposition of the organic ruthenium starting material.

Next, a method of forming an upper Ru electrode by forming a seed layer on a dielectric film will be explained.

The upper electrode of a three-dimentional structure capacitor, too, must be formed essentially by CVD having excellent step coverage. To form the Ru film by CVD, the formation temperature must be set to a temperature higher than the decomposition temperature of the starting material. When the formation temperature becomes high, however, the problem such as oxygen vacancy in a dielectric film consisting of a BST film, for example, or its reduction occurs. One of the methods for solving such a problem uses a seed layer for the formation of the upper Ru electrode, too. More concretely, after the dielectric film consisting of the BST film, for example, is formed, sputtering is conducted to form the seed layer of the Ru film, for example. Next, the Ru film is deposited onto the seed layer by CVD under the selective condition for the formation of the Ru film. Since the seed layer exists at this time, the surface of the BST film is not directly exposed to the atmosphere of CVD. In consequence, the upper electrode/dielectric interface can be chemically stabilized and eventually, degradation of the capacitor characteristics can be suppressed. At this time, the upper limit at which the selective growth is possible does not preferably exceed the highest temperature of 450° C. in FIG. 3c. Interaction starts occurring between the dielectric film and the Ru metallic film at a higher temperature. Another method for solving the problem described above utilizes the phenomenon of the increase of the effects of the seed layer at a lower temperature as explained with reference to FIG. 3c. In this case, the Ru film can be formed at a lower temperature than when the dielectric film is formed directly, and this method can therefore solve the problem of the occurrence of oxygen vacancy in the dielectric film. Even when the seed layer is used, the formation temperature of the selective Ru metallic film is preferably higher than 200° C. Decomposition of the organic ruthenium starting material is not promoted at a lower temperature.

Finally, limitation to the film formation condition of CVD will be described. The boundary conditions of the formation temperature for the selective growth and the oxygen pressure change shown in FIGS. 3a to 3c depend first on the construction of the film formation apparatus. Generally, the film formation temperature cannot be determined primarily due to the difference of the heating method of the sample and the measuring method of the temperature. The pressure greatly changes depending on the mode of flowing of a gas inside the apparatus and the positional relation between the sample and the gas flow. However, when the total pressure inside the apparatus exceeds 10 Torr, a gaseous phase reaction starts occurring and when it is lower than 0.1 Torr, the film formation rate drops drastically. Therefore, the pressure is preferably in between these pressures. The difference of the Ru starting material basically affects the boundary conditions. Furthermore, even when the same Ru starting material is used, the boundary condition generally shifts to higher temperature side and a higher oxygen partial pressure side when means for diluting the Ru starting material by a solvent and transferring the solution from a starting material vessel to a film formation chamber is employed than in a solid sublimation or bubbling transfer method that transfers the starting material as such. Even in the same solvent dilution method, the difference of the solvent used varies the boundary condition, too.

In either case, however, the essence of the present invention remains unaltered in that the Ru film can be selectively grown by CVD among the three factors of the deposition preventing layer of TiN, the silicon oxide film and the Ru film provided that a suitable film formation condition is selected. In addition, the overall tendency of the selective growth is in agreement with the tendency shown in FIGS. 3a to 3c. In other words, the present invention is applicable to all the cases and can similarly accomplish the capacitor structure. Besides Ru, it is possible to similarly use Ir and Pt as the material of the capacitor electrode as already described.

Embodiment 1

Embodiment 1 will be explained with reference to FIGS. 4a to 4d. In this embodiment, a ruthenium (Ru) film is selectively deposited by using a deposition preventing film and a concave lower Ru electrode is formed.

First, a layer for a capacitor interlayer insulating film made of $SiO_2$ and having a film thickness of 400 nm is deposited on plugs 1 made of Ru and a plug interlayer insulating film 2 made of $SiO_2$ by CVD using a monosilane gas as the starting material. Subsequently, a layer for a deposition preventing film 4 made of a 50 nm-thick TiN film is deposited by reactive sputtering. The sputtering condition of the TiN film is as follows. A Ti target having purity of 99.99% is used as the target, a substrate temperature is 500° C., incident power is 12 kW, an $Ar/Nr_2$ flow ratio is ⅓ and a pressure is 1 mTorr. A resist is applied and developed thereafter by a known photolithographic process, and dry etching is conducted for the layer for the deposition preventing film 4 to the surface of the layer for the capacitor interlayer insulating film 3 with the resist as the mask to form the deposition preventing film 4. Incidentally, the deposition preventing film 4 is etched to the etching shape such that a hole becomes elliptically cylindrical.

Figure 1A:
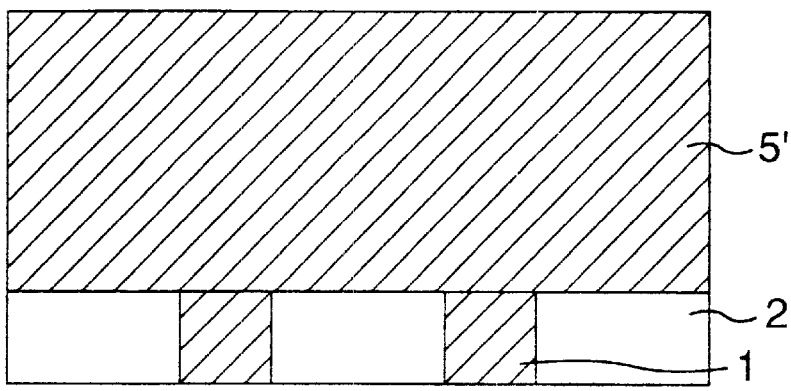
FIGS. 1a to 1c are sectional views each showing a manufacturing step of a structure fabricated and examined by the inventors of the present invention by way of experiment.
Figure 1B:
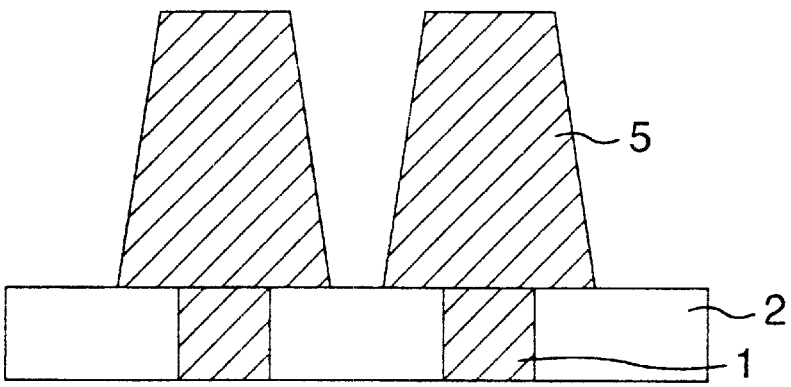
Figure 1C:
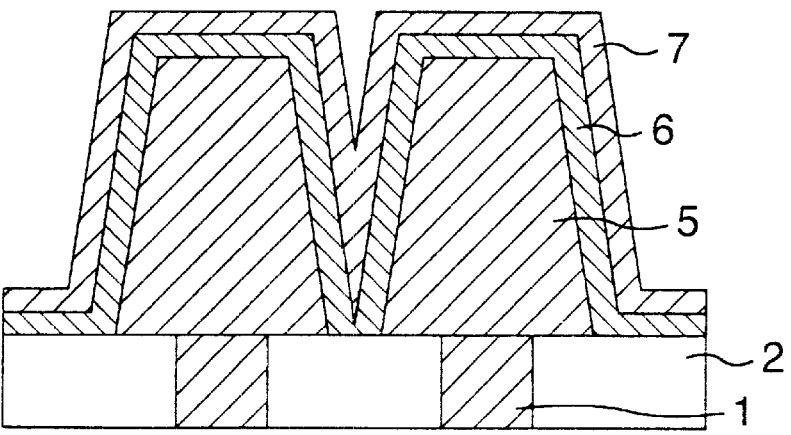

After the resist is removed, the layer for the capacitor interlayer insulating film 3 is dry etched till the surface of the plugs 1 with the deposition preventing film 4 as the mask to form the capacitor interlayer insulating film 3 (FIG. 1a). This method can form the deposition preventing film 4 in self-alignment in the region of the lower electrode where deposition of the Ru film is not desired, that is, on the top surface of the capacitor interlayer insulating film 3. Incidentally, the etching shape of the capacitor interlayer insulating film is such that the holes become elliptically cylindrical and the bottom surface and the side surface (inner surface) of the holes are used as the capacitor. (Hereinafter, the term "side surface" of the holes will mean the "inner surface" of the holes, too.) A 30 nm-thick lower electrode 5 made of Ru is then deposited by CVD. The deposition condition of the Ru lower electrode is as follows. An organic ruthenium compound as the starting material such as $Ru(EtCp)_2[Ru(C_2H_5C_5H_4)_2$:bis(ethylcyclopentadienyl)ruthenium] is supplied by a liquid bubbling method using Ar as a carrier gas. The deposition temperature is 230° C. and the pressure is 0.5 Torr. To promote decomposition of the starting material, an $O_2$ gas having a concentration of 1% on the basis of Ar as the carrier gas is mixed with the starting material immediately before a film formation chamber. Incidentally, a $RuO_2$ film is not formed but a metallic film of Ru is deposited. Since selectivity of deposition of the ruthenium film to the underlayer occurs under this condition, the Ru film is deposited to the bottom surface of the holes (on the plugs 1 made of Ru and the plug interlayer insulating film 2 made of $SiO_2$) and to the side surface (on the capacitor interlayer insulating film 3) as shown in FIG. 4b. However, the Ru film is not deposited to the top surface of the capacitor interlayer insulating film (deposition preventing film 4 made of the TiN film).

Since the TiN film 4 is electrically conductive, however, electric insulation between the capacitors as the object of the present invention is not yet accomplished. Therefore, oxidation heat-treatment is conducted after the Ru film of the lower electrode is deposited. Since TiN has a greater absolute value of oxidation free energy than Ru, it is possible to oxidize only the TiN film and to render it electrically non-conductive without oxidizing the Ru film. More concretely, when heat-treatment is conducted at 400° C. for 10 minutes in an oxygen gas, the TiN film is oxidized to a $TiO_2$ film and becomes non-conductive. Though the Ru film is oxidized on the surface, its bulk remains as the Ru metallic film. Since the TiN film of the deposition preventing film is exposed to the oxidizing atmosphere at the time of deposition of the BST film of the dielectric material or during the crystallization heat-treatment even when the oxidization heat-treatment is not intentionally conducted, it is oxidized and becomes electrically non-conductive. As a result of these steps, the isolation layer 8 can be formed on only the top surface of the capacitor interlayer insulating film (FIG. 4c).

Figure 4A:
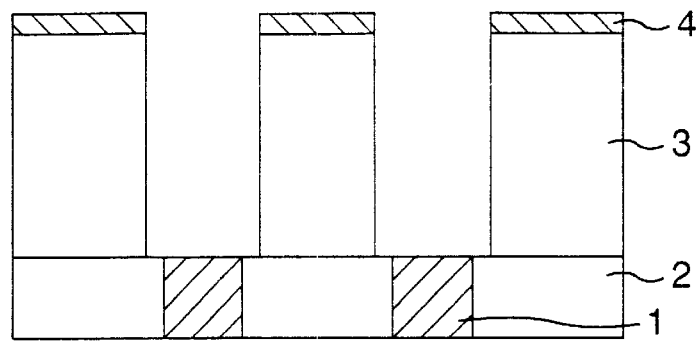
FIGS. 4a to 4d are sectional views of manufacturing steps useful for explaining Embodiment 1 of the present invention.
Figure 4B:
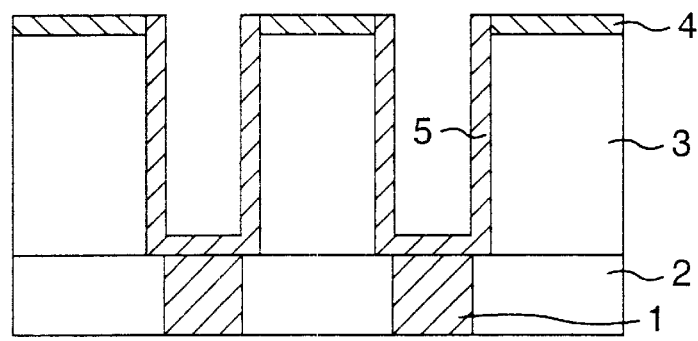
Figure 4C:
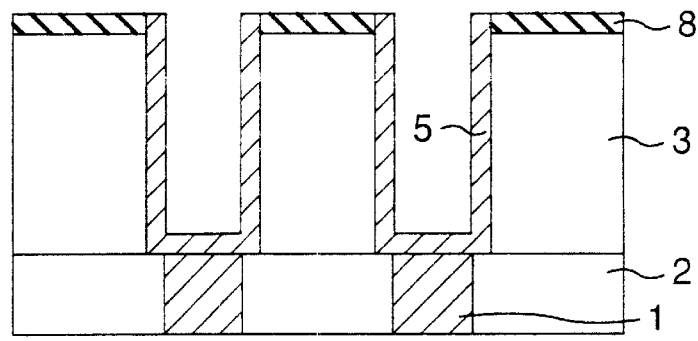
Figure 4D:
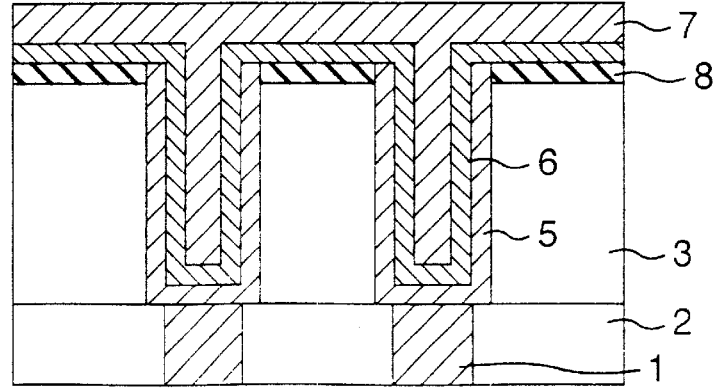

An oxide dielectric material 6 consisting of a BST film and an upper electrode 7 consisting of a Ru film are then deposited serially by CVD (FIG. 4d). The deposition condition of the BST film is as follows. The Ba starting material is $Ba(DPM)_2[Ba\{(CH_3)_3CCOCH_2COC(CH_3)_3\}_3$:bariumdipivaloylmethane. The Sr starting material is $Sr(DPM)_2[Sr\{(CH_3)_3CCOCH_2COC(CH_3)_3\}_3$:strontium dipivarolylmethane]. The Ti starting material is $Ti(OC_3H_7)_4$ (triisopropoxide titanium). These starting materials are supplied by a liquid bubbling method using Ar as a carrier gas. The deposition temperature is 400° C. and the pressure is 0.5 Torr. After the BST film is deposited, heat-treatment is conducted at 600° C. for 30 seconds in an oxygen gas to promote crystallization of the BST film. The growing condition of Ru of the upper electrode deposited after the heat-treatment of the BST film is as follows. The Ru starting material, $Ru(EtCp)_2[Ru(C_2H_5C_5H_4)_2$:bis(ethylcyclopentadienyl)ruthenium], is supplied by the liquid bubbling method using Ar as a carrier gas. The deposition temperature is 230° C. and the pressure is 0.5 Torr. However, a 10% $O_2$ gas on the basis of Ar as the carrier gas is mixed with the Ru starting material immediately before the film formation chamber. Incidentally, a $RuO_2$ film is not formed but a metallic film of Ru is deposited.

According to this Embodiment 1, a step of electrically isolating capacitors by a sputter-etching process after the deposition of Ru of the lower electrode can be omitted.

The material of the deposition preventing film is not limited to the TiN film described above, and materials having smaller oxidation free energy than that of Ru (having a greater absolute value) can be used. Examples of such materials are metals such as Ti, W, Ta and Pb, and their nitrides. Similar effects can also be obtained in such cases. The material of the oxide dielectric film is not limited to barium strontium titanate described above, and it is also possible to use tantalum oxides, strontium titanate, lead zirco-titanate and $SrBi_2Ta_2O_9$ (SBT). The material of the lower electrode and the upper electrode is not limited to ruthenium described above, and platinum and iridium can be used.

Besides $Ru(EtCp)_2[Ru(C_2H_5C_5H_4)_2$: bis(ethylcyclopentadienyl)ruthenium] described above, it is also possible to use organic Ru compounds as the starting materials of CVD for forming the lower and upper electrodes such as $Ru(Cp)_2[Ru(C_5H_5)_2$: bis(cyclopentadienyl)ruthenium],$Ru(MeCp)_2[Ru(CH_3C_5H_4)_2$: bis(methylcyclopentadienyl)ruthenium] and $Ru(DPM)_3[Ru\{(CH_3)_3CCOCH_2COC(CH_3)_3\}_3$:ruthenium dipivaloylmethane]. Similar effects can be obtained in these cases and also in the case where these starting materials are diluted by an ether compound solvent.

The deposition condition of the lower Ru electrode is not limited to the condition described above, and similar effects can be obtained when deposition is conducted under the condition providing selectivity to the underlayer where the film is formed on the $SiO_2$ film but not on the deposition preventing film. Concretely speaking, it is essential that the pressure is higher than 0.1 Torr but not higher than 10 Torr. The formation temperature must be 200° to 300° C. When the Ru starting material is diluted by the ether compound solvent, however, the condition providing Ru selectivity shifts to a higher temperature side by 50° to 100° C. Therefore, the formation temperature must be from 250° to 400° C. The concentration of oxygen contained in the atmosphere so as to promote decomposition of the starting material must be from 0.01 to 70%.

Embodiment 2

Embodiment 2 will be explained with reference to FIGS. 5a to 5d. In this embodiment, a ruthenium film is selectively deposited by using a deposition preventing film to form a concave lower ruthenium electrode in the same way as in Embodiment 1. However, the deposition preventing film is removed before the formation of an oxide dielectric and in this point, Embodiment 2 is different from Embodiment 1.

Figure 5A:
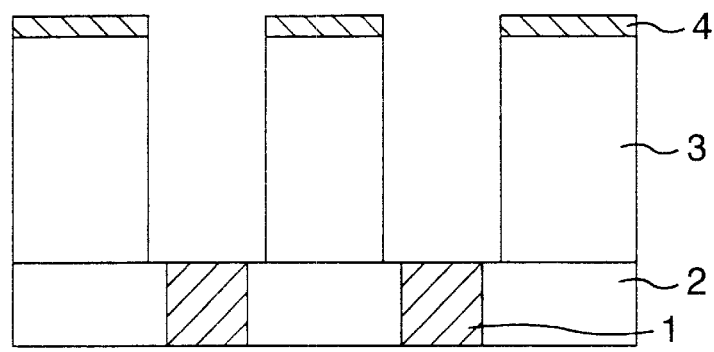
FIGS. 5a to 5d are sectional views of manufacturing steps useful for explaining Embodiment 2 of the present invention.
Figure 5B:
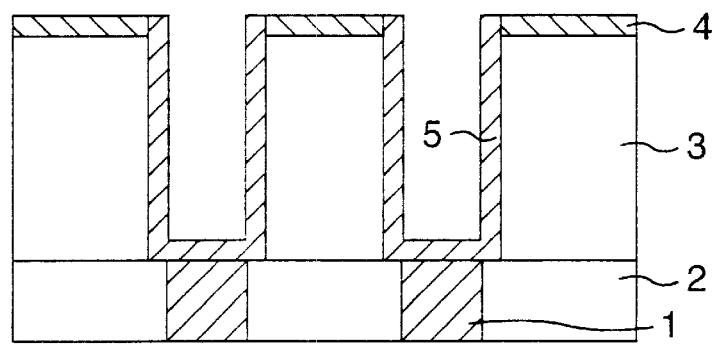
Figure 5C:
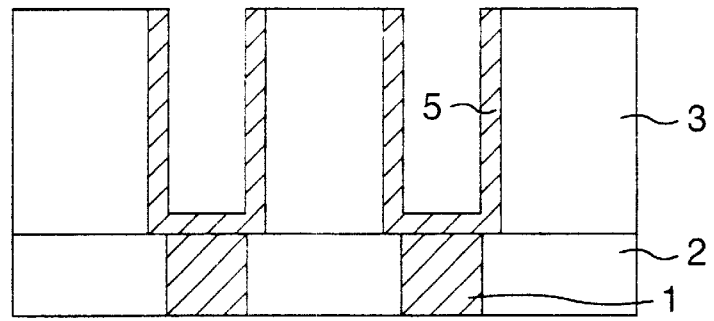

FIGS. 5a and 5b show a similar construction to the construction of FIGS. 4a and 4b. Steps for obtaining the construction shown in FIG. 5b are the same as the steps for obtaining the construction shown in FIG. 4b. Therefore, the description of these steps is omitted, and the explanation will be given on the subsequent steps.

Figure 5D:
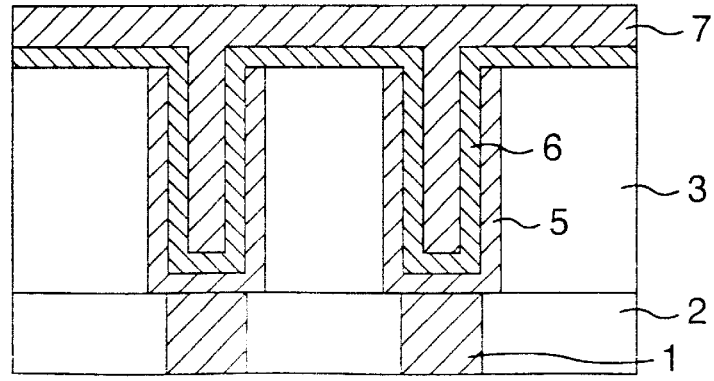

In the construction shown in FIG. 5b, since the TiN film 4 is electrically conductive, electric isolation between the capacitors as the original object of the invention is not yet accomplished as described in Embodiment 1. In this embodiment, therefore, the TiN film 4 is removed after the Ru film 5 of the lower electrode is deposited. The TiN film 4 is etched because the $Cl_2$ gas forms titanium chloride having a high vapor pressure, but the Ru film is not etched because its reactivity with the $Cl_2$ gas is relatively lower. Therefore, only the TiN film can be removed while the Ru film is left. Thereafter, an oxide dielectric material 6 consisting of a BST film and an upper electrode 7 consisting of a Ru film are serially deposited by CVD (FIG. 5d). The deposition condition of the BST film is as follows. The Ba starting material is $Ba(DPM)_2[Ba\{(CH_3)_3CCOCH_2COC(CH_3)_3\}_3$: barium dipivaloylmethane]. The Sr starting material is $Sr(DPM)_2[Sr\{(CH_3)_3CCOCH_2COC(CH_3)_3\}_3$: strontium dipivaloylmethane. The Ti starting material is $Ti(OC_3H_7)_4$ (triisopropoxide titanium). These starting materials are supplied by a liquid bubbling method using Ar as a carrier gas. The deposition temperature is 350° C. and the pressure is 0.5 Torr. Heat-treatment is conducted to promote crystallization of the BST film after the BST film is deposited. The heat-treatment condition is 600° C. for 1 minutes in an oxygen gas. The growing condition of Ru of the upper electrode deposited after the heat-treatment of the BST film is as follows. The staring Ru material, $Ru(EtCp)_2[Ru(C_2H_5C_5H_4)_2$:bis(ethylcyclopentadienyl)ruthenium, is supplied by a liquid bubbling method using Ar as a carrier gas, the deposition temperature is 230° C. and the pressure is 0.5 Torr. However, a 10% $O_2$ gas on the basis of Ar as the carrier gas is mixed immediately before the film formation chamber. The $RuO_2$ film is not formed but a metallic film of Ru is deposited. This Embodiment 2 can omit the step of electrically isolating the capacitors by a sputter-etching process after the deposition of Ru of the lower electrode.

The material of the deposition preventing film is not limited to the TiN film described above, but may be a material having smaller oxidation free energy than Ru (a greater absolute value). For example, metals such as Ti, W, Ta and Pb or their nitrides provide a similar effect. The material of the oxide dielectric film is not limited to barium strontium titanate described above, and tantalum oxides, strontium titanate, lead zirco-titanate and $SrBi_2TaO_9$ (SBT) ferroelectic material can be used similarly. The material of the lower and upper electrodes is not limited to ruthenium described above, and platinum and iridium can be likewise used.

The starting material of CVD for forming the lower and upper electrodes is not limited to $Ru(EtCp)_2[Ru(C_2H_5C_5H_4)_2$: bis(ethylcyclopentadienyl)ruthenium] described above. A similar effect can be obtained by using Ru organic compound starting materials such as $Ru(Cp)_2[Ru(C_5H_5)_2$: bis(cyclopentadienyl)ruthenium], $Ru(MeCp)_2[Ru(CH_3CH_5H_4)_2$: bis(methylcyclopentadienyl)ruthenium] and $Ru(DPM)_3[Ru\{(CH_3)_3CCOCH_2COC(CH_3)_3\}_3$:ruthenium dipivaloylmethane]. A similar effect can also be obtained when these starting materials are diluted by an ether compound solvent.

The deposition condition of the lower Ru electrode is not limited to the condition described above, and a similar effect can be obtained when deposition is conducted under the condition providing selectivity to the underlayer where the film can be formed on the $SiO_2$ film but not on the deposition preventing film. More concretely, the pressure must be from 0.1 to 10 Torr. The formation temperature must be from 200° to 300° C. However, when the Ru starting material is diluted by the ether compound solvent, the condition providing Ru selectivity shifts to a higher temperature side by 50° to 100° C. Therefore, the formation temperature must be from 250° to 400° C. in this case. The concentration of oxygen mixed to promote the decomposition of the starting material must be from 0.01 to 70%.

Embodiment 3

Embodiment 3 will be explained with reference to FIGS. 6a to 6d. This embodiment selectively deposits a ruthenium film by using a deposition preventing film to form an upstanding or pedestal-shaped lower electrode.

First, a layer for a capacitor interlayer insulating film 3 made of $SiO_2$ having a film thickness of 400 nm is deposited on plugs 1 made of Ru and a plug interlayer insulating film 2 made of $SiO_2$ by CVD using a monosilane gas as the starting material. Subsequently, a layer for a deposition preventing film 4 made of a 50 nm-thick TiN film is deposited by reactive sputtering. The sputtering condition of the TiN film is as follows. A Ti target having purity of 99.99% is used as the target, a substrate temperature is 500° C., incident power is 12 kW, an $Ar/N_2$ flow rate ratio is ⅓ and a pressure is 1 mTorr. A resist is then applied and developed by a known photolithographic process and the layer for a deposition preventing film 4 is dry etched till the surface of the layer for the capacitor interlayer insulating film 3 with the resist as the mask to give the deposition preventing film 4. Incidentally, the deposition preventing film 4 is etched to an etching shape such that holes become an elliptic cylinder.

Figure 6A:
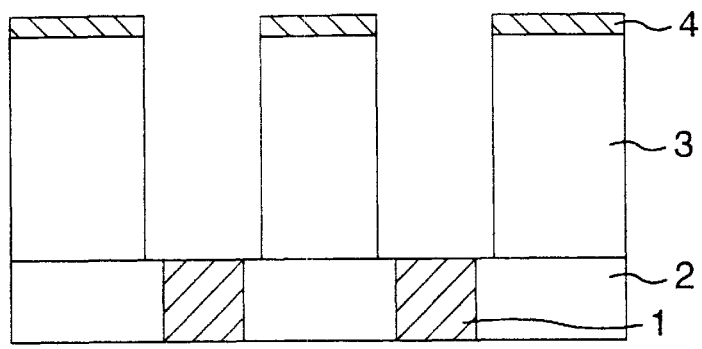
FIGS. 6a to 6d are sectional views of manufacturing steps useful for explaining Embodiment 3 of the present invention.
Figure 6B:
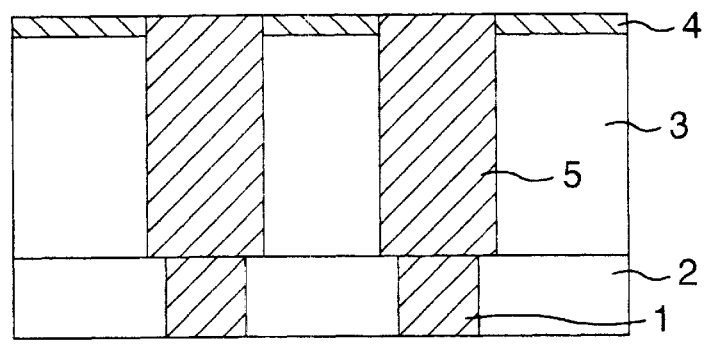
Figure 6C:
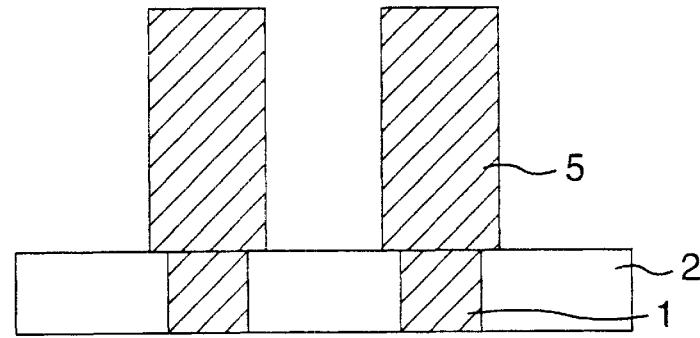

Next, after the resist is removed, the layer for the capacitor interlayer insulating film 3 is dry etched till the surface of the plugs with the deposition preventing film 4 as the mask to form the capacitor interlayer insulating film 3 (FIG. 6a). This method can form the deposition preventing film 4 in self-alignment in the region where deposition of the Ru film of the lower electrode is not desired, that is, on the upper surface of the capacitor interlayer insulating film 3. The capacitor interlayer insulating film is etched into an etching shape such that the holes become an elliptic cylinder. A lower electrode 5 made of Ru is then deposited by CVD. The deposition condition of the Ru lower electrode is as follows. $Ru(EtCp)_2[Ru(C_2H_5C_5H_4)_2$: bis(ethylcyclopentadienyl)ruthenium] as the starting material is supplied by a liquid bubbling method using Ar as a carrier gas. The deposition temperature is 230° C. and the pressure is 0.5 Torr. A 1% $O_2$ gas on the basis of Ar is mixed with the Ru starting material immediately before the film formation chamber to promote decomposition of the starting material. Incidentally, a $RuO_2$ film is not formed but a metallic film of Ru is deposited. Underlayer selectivity of the ruthenium deposition film occurs under this condition. Therefore, the Ru film is deposited to the bottom surface of the holes (on the plugs 1 made of Ru and on the plug interlayer insulating film 2 made of $SiO_2$) and on the inner surface of the holes as shown in FIG. 6b. However, because the Ru film is not deposited to the upper surface of the capacitor interlayer insulating film 3 (on the deposition preventing film 4 made of the TiN film), Ru buries the holes of the interlayer insulating film. In this stage, the surface of the lower ruthenium electrode may be planarized by CMP. In this case, TiN of the deposition preventing film functions as a stopper to polishing. After the Ru film is buried, the deposition preventing film 4 and the interlayer insulating film 3 are removed, an upstanding or pedestal-shaped lower ruthenium electrode is formed (FIG. 6c). To prevent deformation of the lower ruthenium electrode 5 by post heat-treatment, the lower ruthenium electrode 5 is preferably densified by heat-treatment before the deposition preventing film 4 and the interlayer insulating film 3 are removed. More concretely, heat-treatment is conducted at 700° C. for 1 minute in argon, for example. This heat-treatment temperature is preferably higher than the crystallization heat-treatment temperature of the dielectric oxide film.

Thereafter, an oxide dielectric material 6 consisting of a BST film and an upper electrode 7 consisting of a Ru film are serially deposited by CVD (FIG. 3d). The deposition condition of the BST film is as follows. The Ba starting material is $Ba(DPM)_2[Ba\{(CH_3)_3CCOCH_2COC(CH_3)_3\}_3$: barium dipivaolylmethane]. The Sr starting material is $Sr(DPM)_2[Sr\{(CH_3)_3CCOCH_2COC(CH_3)_3\}_3$: strontium dipivaloylmethane]. The Ti starting material is $Ti(OC_3H_7)_4$:(triisopropoxide titanium). These starting materials are supplied by a liquid bubbling method using Ar as a carrier gas. The deposition temperature is 400° C. and the pressure is 0.5 Torr. Heat-treatment is conducted to promote crystallization of the BST film after the BST film is deposited. The heat-treatment is conducted at 600° C. for 30 seconds in an oxygen stream. The growing condition of Ru of the upper electrode deposited after heat-treatment of the BST film is as follows. $Ru(EtCp)_2[Ru(C_2H_5C_5H_4)_2$: bis (ethylcyclopentadienyl)ruthenium] as the starting material is supplied by a liquid bubbling method using Ar as a carrier gas. The deposition temperature is 230° C. and the pressure is 0.5 Torr. However, a 10% $O_2$ gas on the basis of Ar as the carrier gas is mixed with the Ru starting material immediately before the film formation chamber. Incidentally, a $RuO_2$ film is not formed and a metallic film of Ru is deposited.

This Embodiment 3 can easily form the upstanding or pedestal-shaped lower ruthenium electrode.

The material of the deposition preventing film is not limited to the TiN film described above, and a material having smaller oxidation free energy (a greater absolute value) than Ru can be used. For example, a similar effect can be obtained by using a metal such as Ti, W, Ta or Pb or their nitrides. The material of the oxide dielectric material is not limited to barium strontium titanate described above, and a similar effect can be obtained by using tantalum oxides, strontium titanate or lead zirco-titanate or an SBT ferroelectric material. The material of the lower and upper electrodes is not limited to ruthenium, and platinum or iridium can be used similarly.

The starting material of CVD for forming the lower and upper electrodes is not limited to $Ru(EtCp)_2[Cu(C_2H_5CH_4)_2$:bis (ethylcyclopentadienyl)ruthenium] described above. A similar effect can be obtained by using Ru organic compound starting materials e.g. $Ru(Cp)_2[Ru(C_5H_5)_2$: bis (cyclopentadienyl)ruthenium], $Ru(MeCp)_2[Ru(CH_3C_5H_4)_2$: bis(methylcyclopendienyl)ruthenium] and $Ru((DPM)_3[Ru\{(CH_3)_3CCOCH_2COC(CH_3)_3\}_3$: ruthenium dipivaloylmethane]. A similar effect can be further obtained when the starting material described above is diluted with an ether compound solvent.

Besides the deposition condition of the lower Ru electrode described above, a similar effect can be obtained when deposition is conducted under the condition providing underlayer selectivity where the film is formed on the $SiO_2$ film but not on the deposition preventing film. More concretely, the pressure must be from 0.1 to 10 Torr and the formation temperature must be from 200° to 300° C. However, when the Ru starting material is diluted with the ether compound solvent, the condition providing Ru selectivity shifts to a higher temperature side by 50° to 100° C. In this case, the formation temperature must be from 250° to 400° C. The concentration of oxygen contained in the atmosphere to promote the decomposition of the starting material must be from 0.01 to 70%.

Embodiment 4

Embodiment 4 will be explained with reference to FIGS. 7a to 7d. This embodiment selectively deposits a ruthenium film by using a deposition preventing film to form ruthenium plugs.

First, a layer for a deposition preventing film 4 consisting of a 50 nm-thick TiN film is deposited on a layer for a plug interlayer insulating film 2 made of $SiO_2$ by reactive sputtering. The sputtering condition of the TiN film is as follows. A Ti target having purity of 99.99% is used as the target. The substrate temperature is 500° C., incident power is 12 kW, an $Ar/N_2$ flow rate ratio is ½ and the pressure is 1 mTorr. A resist is then applied and developed by a known photolithographic process, and the layer for the deposition preventing film 4 is dry etched till the surface of the layer for the plug interlayer insulating film 2 with the resist as the mask to form the deposition preventing film 4. Incidentally, the deposition preventing film 4 is etched to an etching shape such that holes become cylindrical.

Figure 7A:
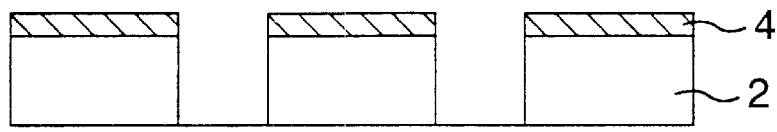
FIGS. 7a to 7d are sectional views of manufacturing steps useful for explaining Embodiment 4 of the present invention.
Figure 7B:
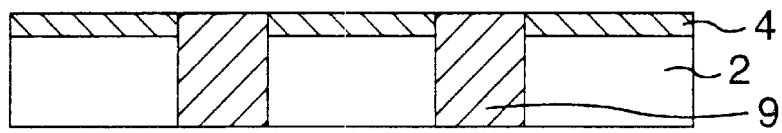

After the resist is removed, the layer for the plug interlayer insulating film 3 is dry etched with the deposition preventing film 4 as the mask to form the plug interlayer insulating film 3 (FIG. 7a). This method can form the deposition preventing film 4 in self-alignment in the region where deposition of the Ru film of the lower electrode is not desired, that is, on the top surface of the plug interlayer insulating film 2. Incidentally, the plug interlayer insulating film 4 is etched into an etching shape such that the holes become cylindrical and each hole is utilized for forming the plug. Plugs 9 made of Ru are then deposited by CVD. The deposition condition of the Ru plugs is as follows. $Ru(EtCp)_2[Ru(C_2H_5C_5H_4)_2$: bis(ethylcyclopentadienyl) ruthenium] as the starting material is supplied by a liquid bubbling method using Ar as a carrier gas. The deposition temperature is 230° C. and the pressure is 0.5 Torr. A 1% $O_2$ on the basis of Ar as the carrier gas is mixed with the Ru starting material immediately before the film formation chamber to promote the decomposition of the starting material. Incidentally, a $RuO_2$ film is not formed but a metallic film of Ru is deposited. Because underlayer selectivity of deposition of the ruthenium film occurs under this condition, Ru is deposited to the bottom surface and the side surface of the hole as shown in FIG. 7b but not on the top surface of the plug portion inter-layer insulating film (on the deposition preventing film 4 consisting of the TiN film). Therefore, Ru buries the opening of the interlayer insulating film. The surface of the ruthenium plugs may be planarized by CMP in this stage. In this case, TiN of the deposition preventing film functions as a stopper to polishing.

Figure 7C:
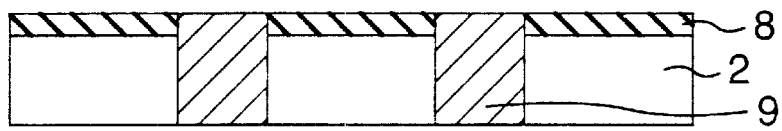

Since the TiN film is electrically conductive, the plugs are not yet isolated electrically from one another. Therefore, after the Ru plug 9 is deposited, oxidation heat-treatment is conducted. Because TiN has a greater absolute value of oxidation free energy than Ru, it is possible to oxidize only the TiN film and to render it non-conductive without oxidizing the Ru film. More concretely, when heat-treatment is conducted at 400° C. for 10 minutes in an oxygen gas, the TiN film 4 is oxidized to $TiO_2$ film 8 and is insulated. Though the surface of the Ru film is oxidized, its bulk remains as the Ru metallic film. After these steps, the ruthenium plugs electrically insulated from adjacent plugs can be formed (FIG. 7c).

Figure 7D:
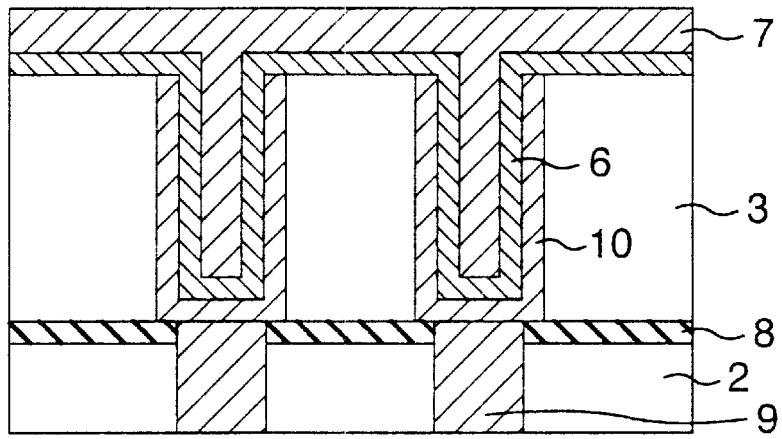

Thereafter, a capacitor interlayer insulating film 3 consisting of $SiO_2$, a lower electrode 10 made of ruthenium, an oxide dielectric material 6 consisting of a BST film and an upper electrode 7 consisting of a Ru film are formed in the same way as in Embodiment 2 (FIG. 7d).

This Embodiment 4 can easily form the ruthenium plugs by the burying process.

The material of the deposition preventing film is not limited to the TiN film described above, and a material having smaller oxidation free energy (a greater absolute value) than Ru can be used. For example, a similar effect can be obtained when metals such as Ti, W, Ta and Pb or their nitrides are used. The material of the oxide dielectric is not limited to barium strontium titanate described above. It is possible to use tantalum oxides, strontium titanate, lead zirco-titanate and BST ferroelectrics. The material of the lower and upper electrodes is not limited to ruthenium described above, and platinum and iridium can be used, too.

The starting material of CVD for forming the lower and upper electrodes is not limited to $Ru(EtCp)_2[Ru(C_2H_5C_5H_4)_2$: bis(ethycyclopentadienyl)ruthenium] described above. A similar effect can be obtained when Ru organic compound starting materials e.g. $Ru(Cp)_2[Ru(C_5H_5)_2$: bis(cyclopentadienyl)ruthenium], $Ru(MeCp)_2[Ru(CH_3C_5H_4)_2$: bis(methylcyclopentadienyl)ruthenium] and $Ru(DPM)_3[\{Ru(CH_3)_3CCOCH_2COC(CH_3)_3\}_3$: ruthenium dipivaloylmethane]. A similar effect can be obtained when the starting materials described above are diluted with an ether compound solvent.

The deposition condition of the Ru plugs is not limited to the condition described above. When deposition is conducted under the condition providing underlayer selectivity where the film is formed on the $SiO_2$ film but not on the deposition preventing film, the effect described above can be obtained, too. More concretely, the pressure must be from 0.1 to 10 Torr. The formation temperature must be from 200° to 300° C. However, when the Ru starting materials are diluted with the ether compound solvent, the condition providing Ru selectivity shifts to a higher temperature side by 50° to 100° C. The formation temperature must be from 250° to 400° C. The concentration of oxygen contained in the atmosphere to promote the decomposition of the starting material must be from 0.01 to 70%.

Embodiment 5

Embodiment 5 will be explained with reference to FIGS. 8a to 8d. This embodiment selectively deposits a ruthenium film to form ruthenium plugs by using a deposition preventing film in the same way as in Embodiment 4, but is different from Embodiment 4 in that the deposition preventing film is removed.

Figure 8A:
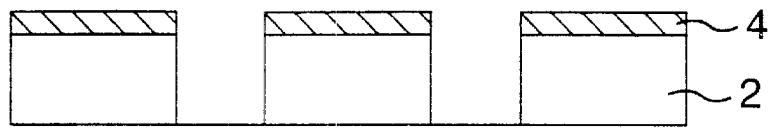
FIGS. 8a to 8d are sectional views useful for explaining Embodiment 5.
Figure 8B:
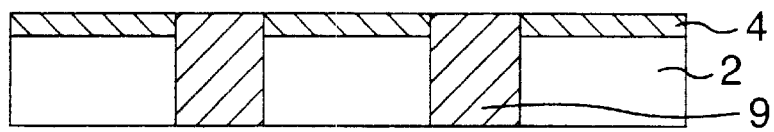

FIGS. 8a and 8b show a construction similar to the construction shown in FIGS. 7a and 7b. A step for obtaining the construction shown in FIG. 8b may be the same as the step for obtaining the construction shown in FIG. 7b. Therefore, the explanation of such a step is omitted, and subsequent steps will be explained.

Figure 8C:
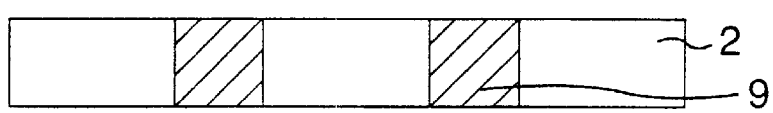

In the construction shown in FIG. 7b, the plugs are not electrically isolated from one another because the TiN film is electrically conductive as explained in Embodiment 4. Therefore, the TiN film 4 is removed in this embodiment after the Ru plugs 9 are deposited. Since the $Cl_2$ gas forms titanium chloride having a high vapor pressure, the TiN film 4 is etched but the Ru plug 9 is not etched because its reactivity to the $Cl_2$ gas is relatively lower. Therefore, only the TiN film 4 can be removed while the Ru plugs 9 are left. In this stage, the surface of the Ru plugs protrudes upward beyond the surface of the plug interlayer insulating film. It is therefore preferred to planarize the surface of the plugs by CMP. After the step described above, the Ru buried plug 9 can be completed (FIG. 8c).

Figure 8D:
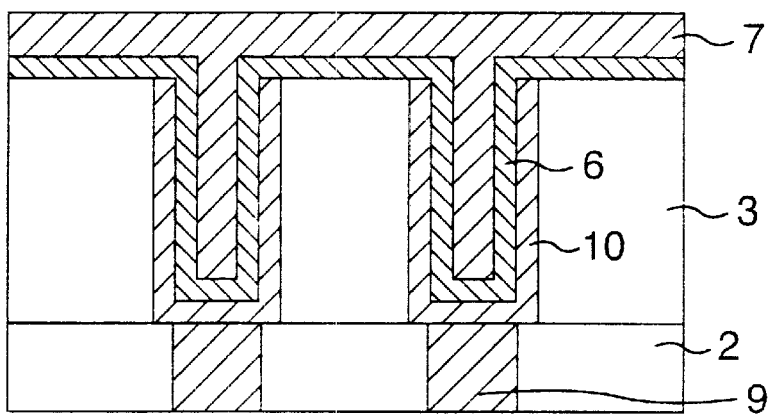

Thereafter, a capacitor interlayer insulating film 3 consisting of $SiO_2$, a lower electrode 10 made of Ru, an oxide dielectric material 6 consisting of a BST film and an upper electrode 7 consisting of a Ru film are formed in the same way as in Embodiment 2 (FIG. 8d).

This Embodiment 5 can easily form a ruthenium plug by the burying process.

The material of the deposition preventing film is not limited to the TiN film described above, and a material having smaller oxidation free energy (a greater absolute value) than Ru may be used. For examples, metals such as Ti, W, Ta and Pb or their nitrides provide a similar effect. The material of the oxide dielectric is not limited to barium strontium titanate described above, and tantalum oxides, strontium titanate, lead zirco-titanate and SBT ferroelectrics may be used, too.

Any of the Ru organic compound materials described in Embodiment 4 can be used as the starting material of CVD for forming the lower and upper electrodes to obtain a similar effect. A similar effect can also be obtained when these starting materials are diluted with an ether compound solvent.

The deposition condition of the Ru plugs is not limited to the condition described above and may be the same as the condition described in Embodiment 4.

Embodiment 6

Embodiment 6 will be explained with reference to FIGS. 9a to 9d. This embodiment uses a two-stage process of sputtering and CVD to selectively deposit a ruthenium film and to obtain an upstanding or pedestal-shaped ruthenium electrode.

Figure 9A:
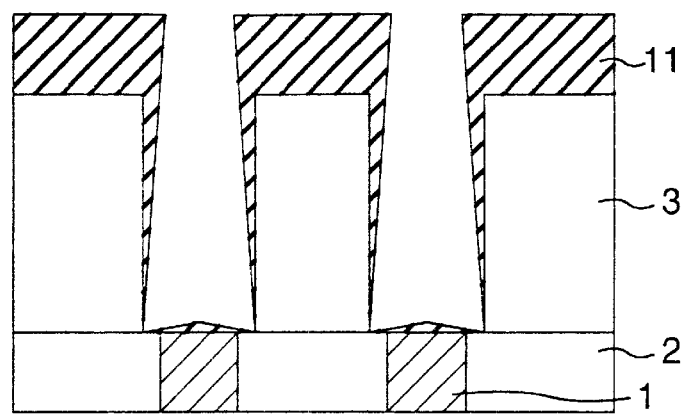
FIGS. 9a to 9d are sectional views of manufacturing steps useful for explaining Embodiment 6 of the present invention.
Figure 9B:
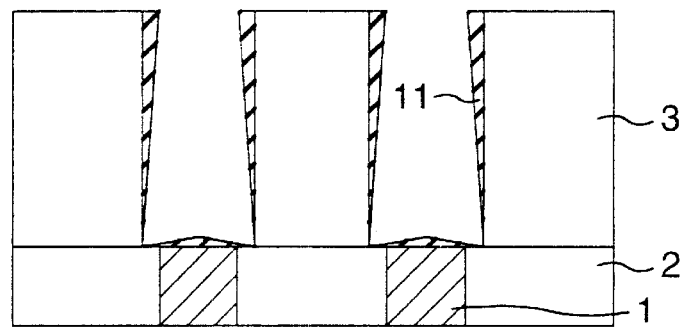
Figure 9C:
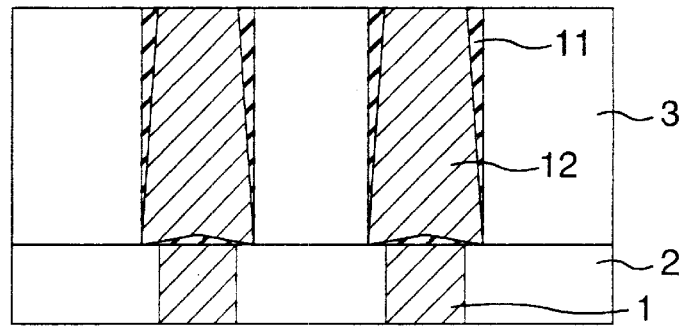
Figure 9D:
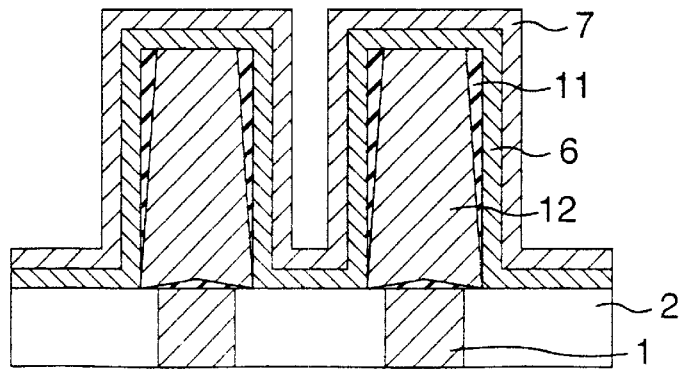

First, a layer for a capacitor interlayer insulating film 3 made of $SiO_2$ having a film thickness of 400 nm is deposited on plugs 1 made of Ru and a plug interlayer insulating film 2 by plasma CVD using a monosilane gas as the starting material. A resist is then applied and developed by a known photolithographic process, and the layer for the capacitor interlayer insulating film 3 is dry etched till the surface of the plugs 1 to form the capacitor interlayer insulating film 3. In this instance, etching is made into an etching shape such that the holes become an elliptic cylinder and the holes are utilized as lower electrodes. After the resist is removed, a lower Ru electrode 11 is deposited by sputtering corresponding to a film thickness of 25 nm. The sputtering condition of the Ru film is as follows. A Ru target having purity of 99.99% is used as the target. The substrate temperature is 300° C., incident power is 1 kW and the pressure is 1 mTorr. When the film thickness distribution is stressed, the film thickness becomes small on the side surface and the bottom surface of the holes because sputtering has low step coverage, and the resulting shape becomes such as the one shown in FIG. 9a. Next, the Ru film formed on the top surface of the capacitor interlayer insulating film 3 is removed by CMP (FIG. 9b). This method can form the Ru film in the region where burying of the Ru film is desired by CVD, that is, on the side surface and the bottom surface of the holes of the capacitor interlayer insulating film. It is hereby preferred to form a stopper such as $Si_3N_4$ on the surface of the capacitor interlayer insulating film when the Ru film is removed by CMP. This stopper may be either removed after CMP or left as such without any problem. A silicon oxide film is preferably buried into the holes of the capacitor interlayer insulating film 3 to prevent particles from falling during CMP. This silicon oxide film must be removed after CMP. After the Ru film is removed by CMP, lower Ru electrodes 12 are deposited by CVD. The deposition condition of the Ru lower electrode is as follows. $Ru(EtCp)_2[Ru(C_2H_5C_5H_4)]$: bis(ethylcyclopentadienyl) ruthenium] as the starting material is supplied by a liquid bubbling method using Ar as a carrier gas. The deposition temperature is 200° C. and the pressure is 0.5 Torr. A 1% oxygen gas on the basis of Ar as the carrier gas is mixed with the Ru starting material immediately before the film formation chamber to promote the decomposition of the starting material. Incidentally, a $RuO_2$ film is not formed but a metallic film of Ru is deposited. Lower layer selectivity of deposition of the ruthenium film occurs under this condition. Therefore, though the Ru film is deposited to the bottom surface and the side surface of the holes as shown in FIG. 9c, the Ru film is not deposited to the top surface of the capacitor interlayer insulating film. In consequence, Ru buries the holes of the interlayer insulating film 3. The surface of the lower Ru electrode 12 may be planarized in this stage by CMP. In such a case, the $Si_3N_4$ film, if left, functions as the stopper to polishing. After the ruthenium film 12 is buried, the capacitor interlayer insulating film 3 is removed, giving an upstanding or pedestal-shaped lower ruthenium electrode 12. To prevent deformation of the lower ruthenium electrode due to post heat-treatment, it is preferred to heat-treat and densify the lower ruthenium electrode before the capacitor interlayer insulating film 3 is removed. Speaking concretely, heat-treatment may be conducted at 700° C. for 1 minute in an inert atmosphere such as in argon, for example. The heat-treatment temperature is preferably higher than the crystallization heat-treatment temperature of the dielectric oxide film.

Figure 6D:
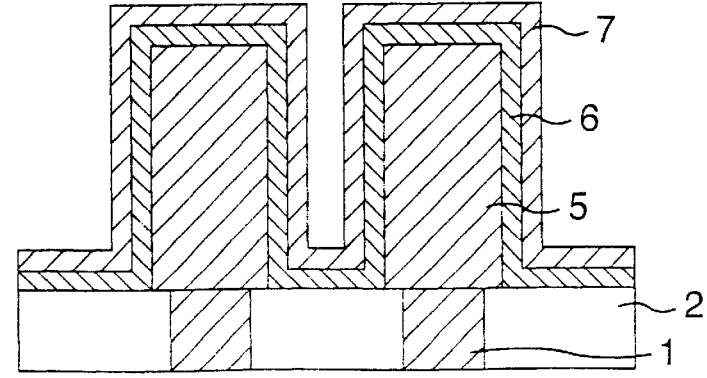

Thereafter, an oxide dielectric material 6 consisting of a BST film and an upper electrode 7 consisting of a Ru film are serially deposited by CVD (FIG. 6d). The deposition condition of the BST film is as follows. The Ba starting material is $Ba(DPM)_2[Ba\{(CH_3)_3CCOCH_2COC(CH_3)_3\}]$: barium dipivaloylmethane]. The Sr starting material is $Sr(DPM)_2[Sr\{(CH_3)_3CCOCH_2COC(CH_3)_3\}_3]$: strontium dipivaloylmethane], and Ti starting material is $Ti(OC_3H_7)_4$: (triisopropoxide titanium). These starting materials are supplied by a liquid bubbling method using Ar as a carrier gas. The deposition temperature is 4,100° C. and the pressure is 0.5 Torr. After the BST film is deposited, heat-treatment is conducted at 600° C. for 20 seconds in an oxygen gas to promote crystallization of the BST film. The growing condition of Ru of the upper electrode deposited after heat-treatment of the BST fim is as follows. The starting material, that is, $Ru(EtCp)_2[Ru(C_2H_5C_5H_4)_2]$: bis (ethylcyclopentadienyl)ruthenium] is supplied by a liquid bubbling method using Ar as a carrier gas. The deposition temperature is 230° C. and the pressure is 0.5 Torr. However, a 10% $O_2$ gas on the basis of Ar as the carrier gas is mixed with the Ru starting material immediately before the film formation chamber. Incidentally, the film is not oxidized and a metallic film of Ru is deposited.

This Embodiment 6 can easily form the upstanding or pedestal-shaped lower ruthenium electrode.

The material of the oxide dielectric film is not limited to barium strontium titanate described above, and tantalum oxides, strontium titanate, lead zirco-titanate and SBT ferroelectrics can be used, too. The material of the lower and upper electrodes is not limited to ruthenium described above, and platinum and iridium can be used, too.

Any of the organic compounds materials described in Embodiment 4 can be used as the material of CVD for forming the lower and upper electrodes, and a similar effect can be obtained. A similar effect can also be obtained when these materials are diluted with an ether compound solvent.

The deposition condition of the lower ruthenium electrode is not limited to the condition described above. A similar effect can be obtained when deposition is conducted under the condition providing underlayer selectivity where the film is formed on the Ru film but not on $SiO_2$. More concretely, the pressure must be 0.1 to 10 Torr and the formation temperature must be 150° to 300° C. However, when the Ru starting material is diluted with the ether compound solvent, the condition providing Ru selectivity shifts to a higher temperature side by 50° to 100° C. In this case, the formation temperature must be 200° to 400° C. The concentration of oxygen contained in the atmosphere to promote decomposition of the starting material must be 0.01 to 70%.

Embodiment 7

Embodiment 7 will be explained with reference to FIGS. 10a to 10d. This embodiment selectively deposits a ruthenium film by a two-stage process of sputtering and CVD to form ruthenium plugs.

First, a layer for a plug interlayer insulating film made of $SiO_2$ is formed. A resist is then applied and developed by a known photolithographic process, and the layer for the plug interlayer insulating film 2 is dry etched with the resist as the mask to give the plug interlayer insulating film 2. The plug interlayer insulating film is etched into an etching shape such that holes become cylindrical, and are utilized as plugs. After the resist is removed, ruthenium 13 is deposited by sputtering corresponding to a film thickness of 5 nm. The sputtering condition of the Ru film is as follows. A Ru target having purity of 99.99% is used as the target. The substrate temperature is 300° C., incident power is 1 kW and the pressure is 1 mTorr. Since sputtering has low step coverage, the holes have a small thickness on the side surface and the bottom surface and the shape is such as the one shown in FIG. 10a. This drawing shows the shape with emphasis because the sputtered film is as thin as 5 nm.

Figure 10A:
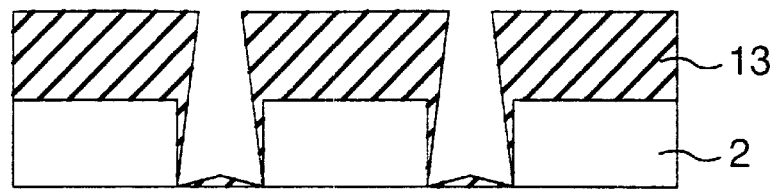
FIGS. 10a to 10d are sectional views of manufacturing steps useful for explaining Embodiment 7 of the present invention.
Figure 10B:
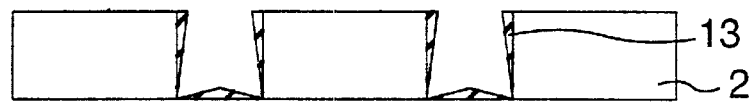
Figure 10C:
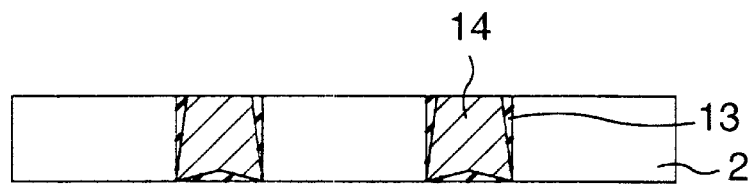

Next, the Ru film formed on the top surface of the plug interlayer insulating film 3 is removed by CMP (FIG. 10b). This method can form by CVD the Ru film as the underlayer in the region where burying of the Ru film is desired, that is, in the open portions of the plug interlayer insulating film 2. It is desired hereby to form a stopper such as $Si_3N_4$ on the surface portion of the plug interlayer insulating film when the Ru film is removed by CMP. This stopper may be removed after CMP or may be left as such without any problem. It is also preferred to bury a silicon oxide film to prevent particles from falling into the holes of the plug interlayer insulating film 3 during CMP. This silicon oxide film needs to be removed after CMP. After the Ru film is removed by CMP, ruthenium plugs 14 are deposited by CVD. The deposition condition of the Ru plugs is as follows. The starting material, $Ru(EtCp)_2[Ru(C_2H_5C_5H_4)$: bis (ethylcyclopentadienyl)ruthenium], is supplied by a liquid bubbling method using Ar as a carrier gas. The deposition temperature is 200° C. and the pressure is 0.5 Torr. A 1% $O_2$ gas on the basis of Ar as the carrier gas is mixed with the starting material immediately before the film formation chamber to promote decomposition of the starting material. Incidentally, a $RuO_2$ film is not formed but a metallic film of Ru is deposited. Because this condition provides underlayer selectivity of deposition of the ruthenium film, the Ru film is deposited to the bottom surface and the side surface of the holes as shown in FIG. 10c, but is not deposited to the top surface of the plug interlayer insulating film. Therefore, Ru buries the hole of the inter-layer insulating film. In this stage, the surface of the ruthenium plugs may be planarized by CMP. When the $Si_3N_4$ film described above is left in this case, it functions as a stopper to polishing.

Figure 10D:
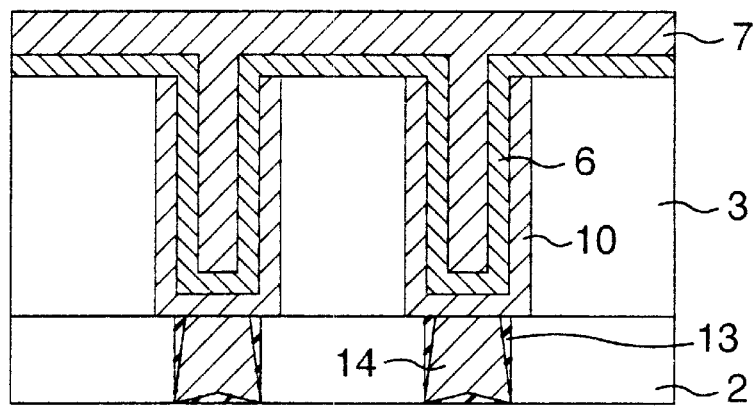

Thereafter, a capacitor interlayer insulating film 3 made of $SiO_2$, a lower electrode 10 made of ruthenium, an oxide dielectric material 6 consisting of a BST film and an upper electrode 7 consisting of a Ru film are formed in the same way as in Embodiment 2 (FIG. 10d).

This Embodiment 7 can easily form the ruthenium plugs by a burying process.

The material of the oxide dielectric film is not limited to barium strontium titanate described above, and tantalum oxides, strontium titanate, lead zirco-titanate and SBT ferroelectrics can be used, too. The material of the lower and upper electrodes is not limited to ruthenium, and platinum and iridium can be used, too.

Any of the organic compound materials described in Embodiment 4 can be used as the starting material of CVD for forming the lower and upper electrodes, and a similar effect can be obtained. A similar effect can also be obtained when these materials are diluted with an ether compound solvent.

The deposition condition of the Ru plugs may be the same as the condition described in Embodiment 4.

Embodiment 8

Embodiment 8 will be explained with reference to FIGS. 11a to 11d. This embodiment deposits a ruthenium film in two stages by CVD to form an upstanding or pedestal-shaped ruthenium electrode.

Figure 11A:
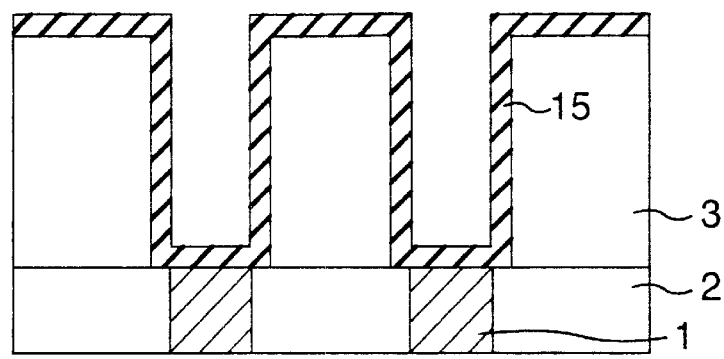
FIGS. 11a to 11d are sectional views of manufacturing steps useful for explaining Embodiment 8 of the present invention.

First, a layer for a capacitor interlayer insulating film 3 made of $SiO_2$ having a film thickness of 400 nm is deposited on plugs 1 made of Ru and a plug interlayer insulating film 2 made of $SiO_2$ by plasma CVD using a monosilane gas as a starting material. A resist is then applied and developed by a known lithographic process, and the layer for the capacitor interlayer insulating film 3 is dry etched till the surface of the plugs 1 with the resist as the mask, giving the capacitor interlayer insulating film 3. The etching shape in this case is such that holes become an elliptic cylinder and are used for forming a lower electrode. After the resist is removed, a first lower ruthenium electrode 15 is deposited to the entire surface by CVD (FIG. 11a). The deposition condition of this Ru lower electrode is as follows. The starting material, that is, $Ru(EtCp)_2[Ru(C_2H_5C_5H_4)_2$:bis(ethylcyclopentadienyl) ruthenium], is supplied by a liquid bubbling method using Ar as a carrier gas. The deposition temperature is 230° C. and the pressure is 0.5 Torr. A 1% $O_2$ gas on the basis of Ar as the carrier gas is mixed with the Ru starting material immediately before the film formation chamber to promote decomposition of the starting material. Incidentally, a $RuO_2$ film is not formed but a metallic film of Ru is deposited.

Figure 11B:
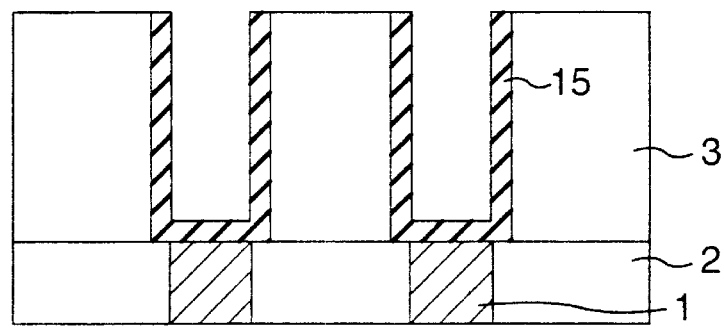

Next, the Ru film formed on the top surface of the capacitor interlayer insulating film 3 is removed by CMP (FIG. 11b). This method can form by CVD the Ru film as the underlayer in the region where burying of the Ru film is desired, that is, on the inner surface and the bottom surface of the holes of the capacitor interlayer insulating film 3. It is preferred hereby to form a stopper such as $Si_3N_4$ on the surface portion of the capacitor interlayer insulating film when the Ru film is removed by CMP. This stopper may be removed after CMP, or may be left as such without any problem. It is also preferred to bury a silicon oxide film to prevent particles from falling into the holes of the capacitor interlayer insulating film 3 during CMP. This silicon oxide film needs to be removed after CMP. It is further preferred to heat-treat and densify in this stage the first lower ruthenium electrode. The heat-treatment is conducted at 700° C. for about 1 minute in an argon atmosphere, for example. A second lower ruthenium electrode 16 is deposited by CVD after the Ru film is removed by CMP. The deposition condition of the Ru lower electrode is as follows. The starting material, that is, $Ru(EtCp)_2[Ru(C_2H_5C_5H_4)_2$: bis (ethylcyclopentadienyl)ruthenium], is supplied by a liquid bubbling method using Ar as a carrier gas. The deposition temperature is 200° C. and the pressure is 0.5 Torr.

Figure 11C:
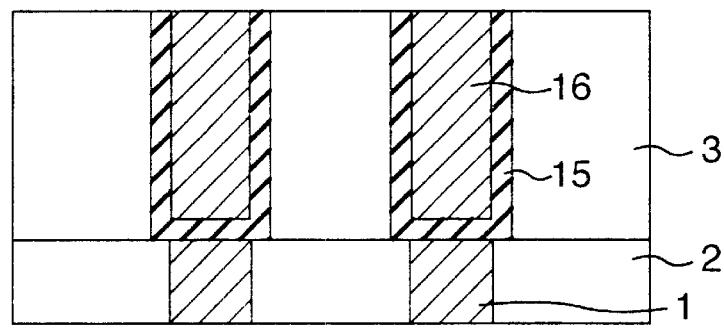

A 1% $O_2$ gas on the basis of Ar as the carrier gas is mixed with the Ru starting material immediately before the film formation chamber to promote decomposition of the starting material. Incidentally, a $RuO_2$ film is not formed but a metallic film of Ru is deposited. Since underlayer selectivity of deposition of the ruthenium film occurs under this condition (FIG. 11c), a Ru film is deposited on the bottom surface and the side surface of the holes as shown in FIG. 11c, but is not deposited on the top surface of the capacitor interlayer insulating film 3. Therefore, Ru buries the holes of the interlayer insulating film. The surface of the lower ruthenium electrode may be planarized in this stage by CMP. In this case, the $Si_3N_4$ film described above, if left, serves as a stopper to polishing. After the ruthenium film is buried, the capacitor interlayer insulating film 3 is removed, giving thereby an upstanding or pedestal-shaped lower ruthenium electrode. To prevent deformation of the lower ruthenium electrode due to post heat-treatment, it is preferred to heat-treat and densify the lower ruthenium electrode before the capacitor interlayer insulating film 3 is removed. More concretely, this heat-treatment may be conducted at 700° C. for 1 minute in an inert atmosphere such as argon. This heat-treatment temperature is preferably higher than the heat-treatment temperature for crystallizing the dielectric oxide film.

Figure 11D:
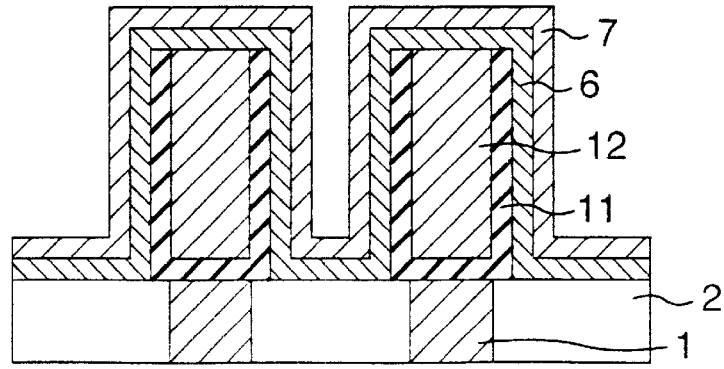

Thereafter, an oxide dielectric material 6 consisting of a BST film and an upper electrode 7 consisting of a Ru film are serially deposited by CVD (FIG. 11d). The deposition condition of the BST film is as follows. The Ba starting material is $Ba(DMP)_2[Ba\{(CH_3)_3CCOCH_2COC(CH_3)_3\}_3$: barium dipivaloylmethane]. The Sr starting material is $Sr(DPM)_2[Sr\{(CH_3)_3CCOCH_2COC(CH_3)_3\}_3$: strontium dipivaloymethane]. The Ti starting material is Ti(OC$_3$H$_7$)$_4$ (triisopropoxide titanium). These starting materials are supplied by a liquid bubbling method using Ar as a carrier gas. The deposition temperature is 350° C. and the pressure is 0.5 Torr. After the BST film is deposited, heat-treatment is conducted at 600° C. for 1 minute to promote crystallization of the BST film. The growing condition of Ru of the upper electrode after this heat-treatment of the BST film is as follows. The starting material, that is, Ru(EtCp)$_2$[Ru (C$_2$H$_5$C$_5$H$_4$)$_2$: bis(ethylcyclopentadienyl)ruthenium], is supplied by a liquid bubbling method using Ar as a carrier gas. The deposition temperature is 230° C. and the pressure is 0.5 Torr. However, a 10% O$_2$ gas on the basis of Ar as the carrier gas is mixed with the Ru starting material immediately before the film formation chamber. Incidentally, the film is not oxidized and a metallic film of Ru is deposited.

This Embodiment 8 can easily form the upstanding pedestal-shaped lower ruthenium electrode.

The material of the oxide dielectric film is not limited to barium strontium titanate described above, and tantalum oxides, strontium titanate, lead zirco-titanate and SBT ferroelectrics can be used, too. The material of the lower and upper electrodes is not limited to ruthenium, and platinum and iridium can be used, too.

A similar effect can be obtained when any of the organic compound materials described in Embodiment 4 are used as the starting material of CVD for forming the lower and upper electrodes. A similar effect can also be obtained when these materials are diluted with an ether compound solvent.

The deposition condition of the second lower ruthenium electrode 16 is not limited to the condition described above. A similar effect can be obtained when deposition is conducted under the state providing underlayer selectivity where the film is formed on the Ru film but not on SiO$_2$. More concretely, the pressure must be 0.1 to 10 Torr. The formation temperature must be 150° to 300° C. When the Ru starting material is diluted with an ether compound solvent, however, the condition providing Ru selectivity shifts to a higher temperature side by 50° to 100° C. Therefore, the formation temperature must be 200° to 400° C. in this case. The concentration of oxygen contained in the atmosphere to promote decomposition of the starting material must be 0.01 to 70%.

Embodiment 9

Embodiment 9 will be explained with reference to FIGS. 12a to 12d. This embodiment deposits a ruthenium film in two stages to form an upstanding pedestal-shaped lower ruthenium electrode in the same way as in Embodiment 8, but is different from Embodiment 8 in that a deposition preventing layer is utilized.

Figure 12A:
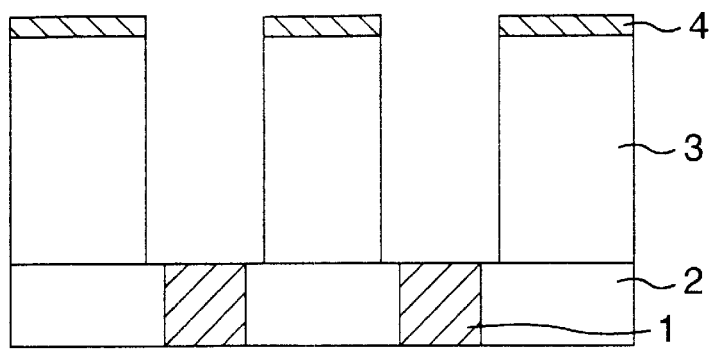
FIGS. 12a to 12d are sectional views of manufacturing steps useful for explaining Embodiment 9 of the present invention.
Figure 12B:
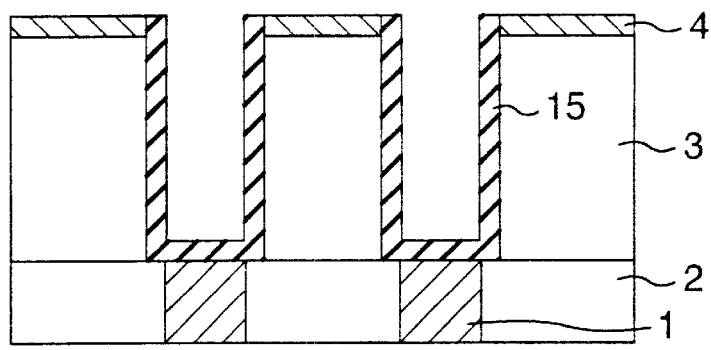

First, a layer for a capacitor interlayer insulating film 3 made of SiO$_2$ and having a film thickness of 400 nm is deposited on plugs 1 made of Ru and a plug interlayer insulating film 2 made of SiO$_2$ by plasma CVD using a monosilane gas as the starting material. A layer for a deposition preventing film 4 consisting of a 50 nm-thick TiN film is then deposited by reactive sputtering. The sputtering condition of the TiN film is as follows. A Ti target having purity of 99.99% is used as the target. The substrate temperature is 500° C., incident power is 12 kW, an Ar/N$_2$ flow rate ratio is 1/7 and the pressure is 1 mTorr. A resist is then applied and developed by a known photolithographic process, and the layer for a deposition preventing film 4 is dry etched till the surface of the layer for a capacitor interlayer insulating film 3 with the resist as the mask, giving the deposition preventing film 4. Incidentally, an etching shape of the deposition preventing film 4 is such that holes become an elliptic cylinder. After the resist is removed, the layer for a capacitor interlayer insulating film 3 is dry etched to the surface of the plugs 1 with the deposition preventing film 4 as the mask, giving the capacitor interlayer insulating film 3 (FIG. 12a). This method can form the deposition preventing film 4 in self-alignment in the region where deposition of the Ru film of the lower electrode is not desired, that is, on the top surface of the capacitor interlayer insulating film 3. An etching shape of this capacitor interlayer insulating film is such that the holes become an elliptic cylinder, and the bottom surface and the side surface of the holes are utilized for forming the lower electrode of the capacitor.

Thereafter, a first lower ruthenium electrode 15 is deposited by CVD corresponding to a film thickness of 50 nm. The deposition condition of the Ru lower electrode is as follows. The starting material, that is, Ru(EtCo)$_2$[Ru(C$_2$H$_5$C$_5$H$_4$)$_2$: bis(ethylcyclopentadienyl)ruthenium], is supplied by a liquid bubbling method using Ar as a carrier gas. The deposition temperature is 230° C. and the pressure is 0.5 Torr. To promote decomposition of the starting material, a 1% O$_2$ gas on the basis of Ar as the carrier gas is mixed with the Ru starting material immediately before the film formation chamber. Incidentally, a RuO$_2$ film is not formed but a metallic film of Ru is deposited. Since underlayer selectivity of deposition of the ruthenium film occurs under this condition, the Ru film is deposited on the bottom surface of the holes (on the plugs 1 made of Ru and on the plug interlayer insulating film 2 made of SiO$_2$) and on the inner surface of the holes but is not deposited to the top surface of the capacitor interlayer insulating film (on the deposition preventing film 4 consisting of the TiN film). The deposition preventing film may be removed in this stage, or after a later-appearing second lower ruthenium electrode is formed. It is preferred to heat-treat and densify the first lower ruthenium electrode in this stage. The heat-treatment may be conducted at 700° C. for about 1 minute in an argon atmosphere.

Figure 12C:
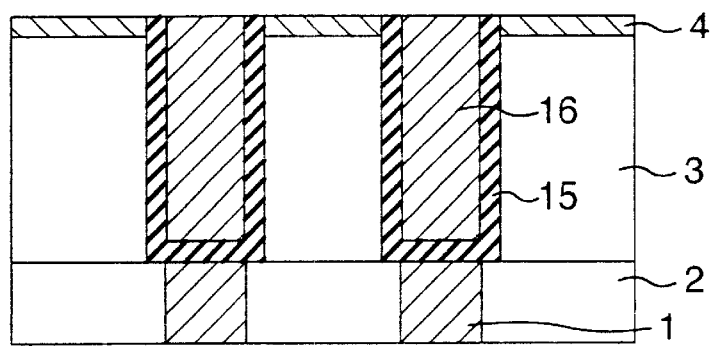

Next, the second lower ruthenium electrode 16 is deposited by CVD. The deposition condition of the Ru lower electrode is as follows. The starting material, Ru(EtCp)$_2$[Ru (C$_2$H$_5$C$_5$H$_4$):bis(ethylcyclopentadienyl)ruthenium], is supplied by a liquid bubbling method using argon as a carrier gas. The deposition temperature is 200° C. and the pressure is 0.5 Torr. To promote decomposition of the starting material, a 1% O$_2$ gas on the basis of Ar as the carrier gas is mixed with the Ru starting material immediately before the film formation chamber. Incidentally, a RuO$_2$ film is not formed but a metallic film of Ru is deposited. Since underlayer selectivity of deposition of the ruthenium film occurs under this condition, Ru is deposited to the bottom surface and the side surface of the holes as shown in FIG. 12c but is not deposited on the top surface of the capacitor interlayer insulating film. Therefore, Ru buries the holes of the interlayer insulating film. The surface of the lower ruthenium electrode may be planarized in this stage by CMP. In such a case, the deposition preventing film 4, if left, serves as a stopper to polishing. After ruthenium is buried, the capacitor interlayer insulating film 3 is removed, giving an upstanding or pedestal-shaped lower ruthenium electrode. To prevent deformation of the lower ruthenium electrode due to post heat-treatment, it is preferred in this instance to heat-treat and densify the lower ruthenium electrode before the capacitor interlayer insulating film 3 is removed. More concretely, this heat-treatment may be conducted at 700° C. for 1 minute in an inert atmosphere such as argon. This heat-treatment temperature is preferably higher than the heat-treatment temperature for crystallizing a dielectric oxide material.

Figure 12D:
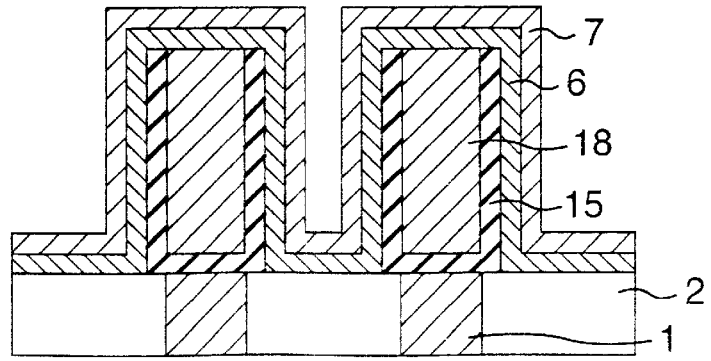

Thereafter, an oxide dielectric material 6 consisting of a BST film and an upper electrode 7 consisting of a Ru film are serially deposited by CVD (FIG. 12d). The deposition condition of the BST film is as follows. The Ba starting material is $Ba(DPM)_2[Ba\{(CH_3)_3CCOCH_2COC(CH_3)_3\}_3$: barium dipivaloylmethane]. The Sr starting material is $Sr(DPM)_2[Sr(CH_3)_3CCOCH_2COC(CH_3)_3]_3$: strontium dipivaloylmethane]. The Ti starting material is $Ti(OC_3H_7)_4$:(triisopropoxide titanium). These starting materials are supplied by a liquid bubbling method using Ar as a carrier gas. The deposition temperature is 410° C. and the pressure is 0.5 Torr. After the BST film is deposited, heat-treatment is conducted to promote crystallization of the BST film. The heat-treatment is carried out at 600° C. for 1 minute in an oxygen gas. The growing condition of Ru of the upper electrode deposited after heat-treatment of the BST film is as follows. The starting material, $Ru(EtCp)_2[Ru(C_2H_5C_5H_4)_2$: bis(ethylcyclopentadienyl)ruthenium], is supplied by a liquid bubbling method using Ar as a carrier gas. The deposition temperature is 230° C. and the pressure is 0.5 Torr. However, a 1% $O_2$ gas on the basis of Ar as the carrier gas is mixed with the Ru starting material immediately before the film formation chamber. Incidentally, the film is not oxidized but a metallic film is deposited.

This Embodiment 9 can easily form the upstanding or pedestal-shaped lower ruthenium electrode.

The material of the oxide dielectric film is not limited to barium strontium titanate described above, and tantalum oxides, strontium titanate, lead zirco-titanate and SBT ferroelectrics can be used, too. The material of the lower and upper electrodes is not limited to ruthenium described above, and platinum and iridium can be used, too.

When any of the Ru organic compound materials described in Embodiment 4 is used as the starting material of CVD for forming the lower and upper electrodes, a similar effect can be obtained. A similar effect can also be obtained when the starting materials are diluted with an ether compound solvent.

The deposition condition of the second lower ruthenium electrodes 16 is not limited to the condition described above, and may be same as the condition described in Embodiment 8.

Embodiment 10

Figure 13A:
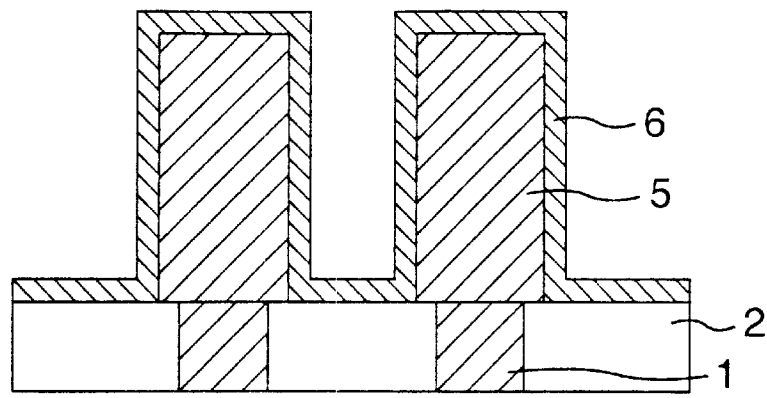
FIGS. 13a to 13c are sectional views of manufacturing steps useful for explaining Embodiment 10 of the present invention.
Figure 13B:
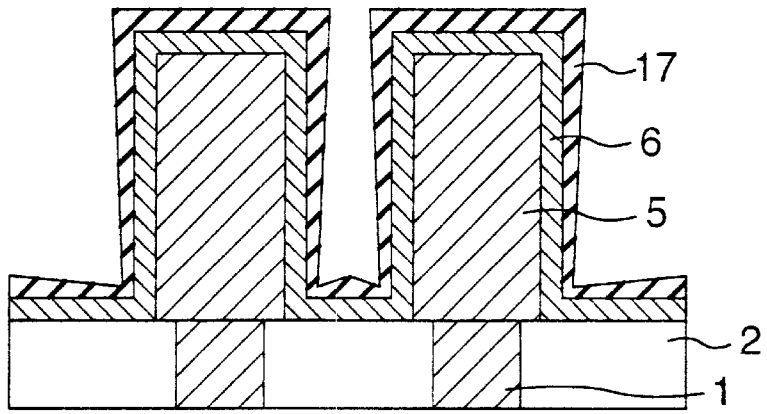
Figure 13C:
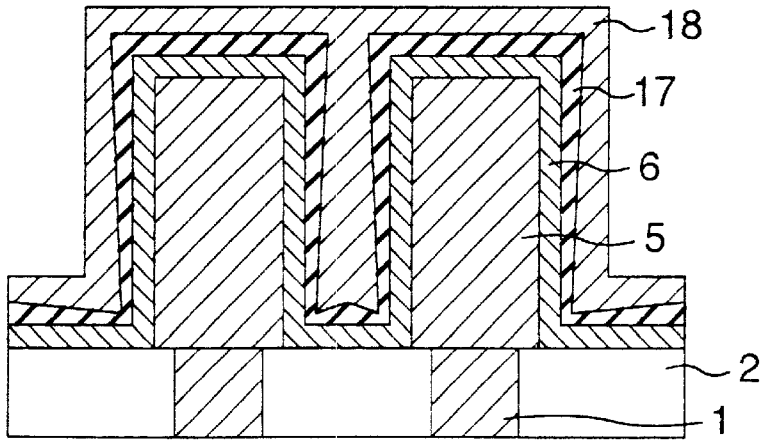

Embodiment 10 will be explained with reference to FIGS. 13a to 13c. This embodiment forms upper ruthenium electrodes by a two-stage process of sputtering and CVD.

First, lower ruthenium electrodes 5 and an oxide dielectric material 6 consisting of BST, for example, are formed on plugs 1 made of Ru and a plug interlayer insulating film 2 made of $SiO_2$. The lower electrodes are formed by using the step of burying the Ru film into the holes by CVD as described in Embodiment 3, 6, 8 or 9. The deposition condition of the BST film is as follows. The Ba starting material is $Ba(DPM)_2[Ba\{(CH_3)_3CCCH_2COC(CH_3)_3\}_3$: barium dipivaloylmethane]. The Sr starting material is $Sr(DPM)_2[Sr\{(CH_3)_3CCOCH_2COC(CH_3)_3\}_3$: strontium dipivaloylmethane]. The Ti starting material is $Ti(OC_3H_7)_4$ (triisopropoxide titanium). These starting materials are supplied by a liquid bubbling method using Ar as a carrier gas. The deposition temperature is 400° C. and the pressure is 0.5 Torr. After the BST film is deposited, heat-treatment is conducted to promote crystallization of the BST film. This heat-treatment is conducted at 600° C. for 1 minute in an oxygen gas (FIG. 13a).

Next, first upper ruthenium electrodes 17 are deposited by sputtering corresponding to a film thickness of 5 nm. The sputtering condition of the Ru film is as follows. A Ru target having purity of 99.99% is used as the target. The substrate temperature is room temperature, incident power is 1 kW and the pressure is 1 mTorr. Since sputtering has low step coverage, the bottom portion of the step has a small thickness when depicted in emphasis and has a shape shown in FIG. 13b.

Second upper ruthenium electrodes 18 are then deposited by CVD. The deposition condition is as follows. The starting material, that is, $Ru(EtCp)_2[Ru(C_2H_5C_5H_4)_2$: bis(ethylcyclopentadienyl)ruthenium], is supplied by a liquid bubbling method using Ar as a carrier gas. To decompose the starting material, a 1% $O_2$ gas is mixed with the Ru starting material immediately before the film formation chamber. Incidentally, a $RuO_2$ film is not formed but a metallic film of Ru is deposited. Since CVD has high step coverage, a Ru film having a sufficient thickness can be formed on the bottom portion of the step, too (FIG. 13c).

When second upper ruthenium electrodes 18 are directly formed by CVD on an oxide dielectric 6 without forming first upper ruthenium electrodes 17 by sputtering, oxygen vacancy develops on the surface of the oxide dielectric film and a leakage current of a capacitor increases. At the same time, the formation atmosphere itself of the electrodes contaminates the surface of the dielectric and deteriorates capacitor performance. Therefore, it is preferred to employ the steps of forming the upper electrodes by sputtering at a low temperature and then to complete the upper electrodes by CVD.

The material of the oxide dielectric film is not limited to barium strontium titanate described above, and tantalum oxides, strontium titanate, lead zirco-titanate and SBT ferroelectrics can be used, too. The material of the upper electrodes is not limited to ruthenium described above, and platinum and iridium can be used, too.

When any of the Ru organic compounds described in Embodiment 4 is used as the material of CVD for forming the second upper electrodes, a similar effect can be obtained. A similar effect can also be obtained when these starting materials are diluted with an ether compound solvent.

The deposition condition of the upper ruthenium electrodes 18 by CVD is not limited to the condition described above, and a similar effect can be obtained when deposition is conducted under the condition where the film can be formed on the Ru film. More concretely, the pressure must be 0.1 to 10 Torr. The formation temperature must be 150° to 350° C. When the Ru starting material is diluted with the ether compound solvent, the condition providing Ru selectivity shifts to a higher temperature side by 50° to 100° C. Therefore, the formation temperature must be 200° to 450° C. in this case. The concentration of oxygen contained in the atmosphere to promote decomposition of the starting material must be 0.01 to 70%.

Embodiment 11

Embodiment 11 will be explained with reference to FIGS. 14a to 14d. This embodiment selectively deposits a ruthenium film by a two-stage process of sputtering and CVD to form concave lower ruthenium electrodes.

Figure 14A:
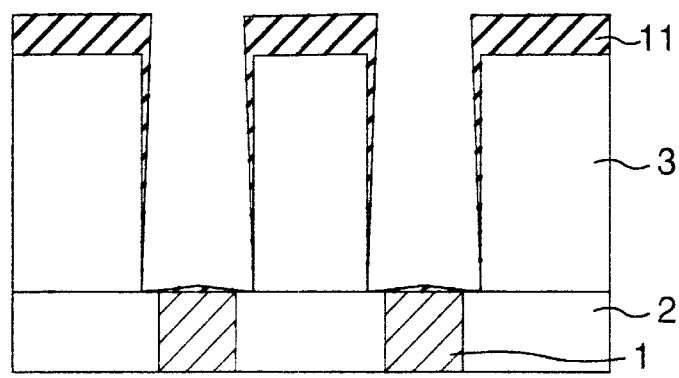
FIGS. 14a to 14d are sectional views of manufacturing steps useful for explaining Embodiment 11 of the present invention.
Figure 14B:
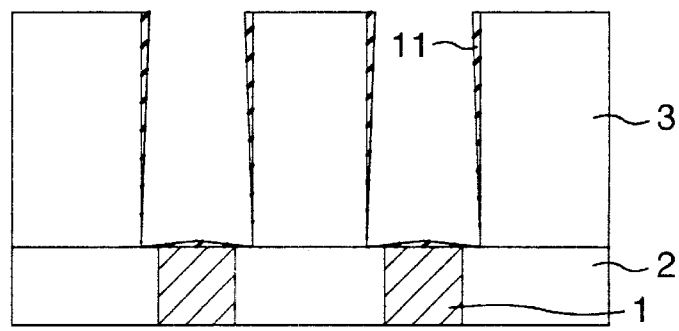

First, a layer for a capacitor interlayer insulating film 3 made of $SiO_2$ and having a film thickness of 400 nm is deposited on plugs 1 made of Ru and a plug interlayer insulating film 2 made of $SiO_2$ by plasma CVD using a monosilane gas as the starting material. A resist is then applied and developed by a known photolithographic process, and the layer for a capacitor interlayer insulating film 3 is dry etched till the surface of the plugs 1 with the resist as the mask, giving the capacitor interlayer insulating film 3. The etching shape is such that holes become an elliptic cylinder and are used as lower electrodes. After the resist is removed, first lower Ru electrodes 11 are deposited by sputtering corresponding to a film thickness of 20 nm. The sputtering condition of the Ru film is as follows. A Ru target having purity of 99.99% is used as the target. The substrate temperature is 300° C., incident power is 1 kW and the pressure is 1 mTorr. Since sputtering has low step coverage, the film thickness is small on the side surface and the section of the holes when the film thickness distribution is stressed, and the shape is such as the one shown in FIG. 14a. Next, the Ru film formed on the top surface of the capacitor interlayer insulating film 3 is removed by CMP (FIG. 14b).

Figure 14C:
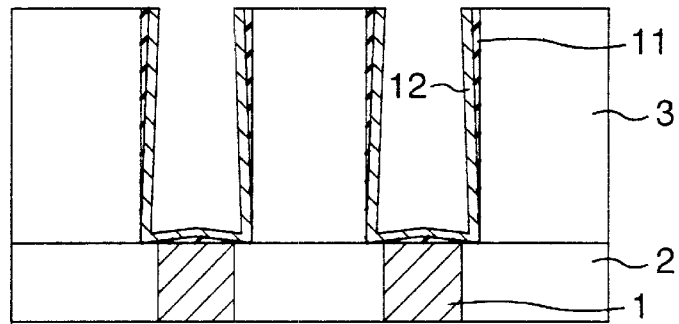

This method can form the Ru film as the underlayer by CVD in the region where selective deposition of the Ru film is desired, that is, on the side surface and the bottom surface of the capacitor interlayer insulating film 3. In this instance, it is preferred to form a stopper such as $Si_3N_4$ on the surface portion of the capacitor interlayer insulating film 3 when the Ru film is removed by CMP. This stopper may be removed after CMP or may be left as such without any problem. It is also preferred to bury a silicon oxide film to prevent particles from falling into the holes of the capacitor interlayer insulating film 3 during CMP. The silicon oxide film must be removed after CMP. After the Ru film is removed by CMP, second lower ruthenium electrodes 12 are deposited by CVD. The deposition condition of the second Ru lower electrodes is as follows. The starting material, $Ru(EtCp)_2$ [$Ru(C_2H_5C_5H_4)_2$: bis(ethylcyclopentadienyl)ruthenium], is supplied by a liquid bubbling method using Ar as a carrier gas. The deposition temperature is 200° C. and the pressure is 0.5 Torr. To promote decomposition of the starting material, a 1% $O_2$ gas on the basis of Ar as the carrier gas is mixed with the Ru starting material immediately before the film formation chamber. Incidentally, a $RuO_2$ film is not formed but a metallic film of Ru is deposited. Since underlayer selectivity of deposition of the ruthenium occurs under this condition, Ru is deposited to the bottom surface and the side surface (inner surface) of the holes as shown in FIG. 14c, but is not deposited on the top surface of the capacitor interlayer insulating film 3. It is preferred hereby to heat-treat and densify the lower ruthenium electrodes to prevent deformation of the second lower ruthenium electrodes 12 due to post heat-treatment. More concretely, this heat-treatment may be conducted at 700° C. for 1 minute in an inert atmosphere such as argon. The heat-treatment temperature is preferably higher than the heat-treatment temperature for crystallizing the dielectric oxide film.

Figure 14D:
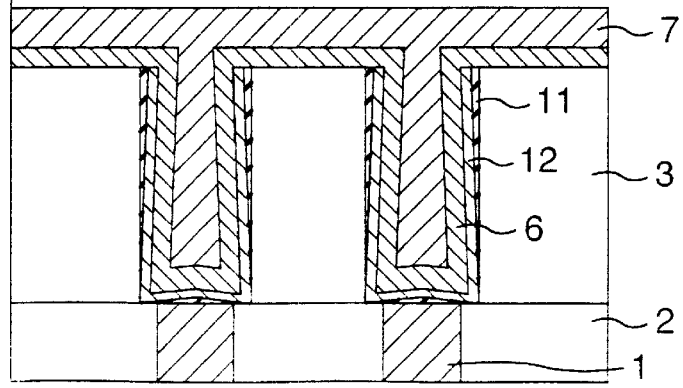

Next, an oxide dielectric material 6 consisting of a BST film and upper electrodes 7 consisting of a Ru film are serially deposited by CVD (FIG. 14d). The deposition condition of the BST film is as follows. The Ba starting materials is $Ba(DPM)_2[Ba\{(CH_3)_3CCOCH_2COC(CH_3)_3\}_3$: barium dipivaloylmethane]. The Sr starting material is $Sr(DPM)_2[Sr\{(CH_3)_3CCOCH_2COC(CH_3)_3\}_3$: strontium dipivaloylmethane]. The Ti starting material is $Ti(OC_3H_7)_4$ (triisopropoxide titanium). These starting materials are supplied by a liquid bubbling method using Ar as a carrier gas. The deposition temperature is 4,100° C. and the pressure is 0.5 Torr. After the BST film is deposited, heat-treatment is conducted to promote crystallization of the BST film. This heat-treatment is conducted at 600° C. for 20 seconds in an oxygen gas. The growing condition of Ru of the upper electrodes deposited after the heat-treatment of the BST film is as follows. The starting material, that is, $Ru(EtCp)_2$[$Ru(C_2H_5C_5H_4)_2$: bis(ethylcyclopentadienyl)ruthenium], is supplied by a liquid bubbling method using Ar as a carrier gas. The deposition temperature is 230° C. and the pressure is 0.5 Torr. However, a 10% oxygen gas on the basis of Ar as the carrier gas is mixed with the Ru starting material immediately before the film formation chamber. Incidentally, the film is not oxidized but a metallic film of Ru is deposited.

This Embodiment 11 can omit the step of isolating electrically the capacitors by a sputter-etching process after deposition of the ruthenium film during the step of forming the concave lower ruthenium electrodes.

The material of the oxide dielectric film is not limited to barium strontium titanate described above, and tantalum oxides, strontium titanate, lead zirco-titanate and SBT ferroelectrics can be used, too. The material of the upper electrodes is not limited to ruthenium described above, and platinum and iridium can be used, too.

A similar effect can be obtained when any of the Ru organic compound materials described in Embodiment 4 is used as the starting material of CVD for forming the second lower electrodes and the upper electrodes. A similar effect can also be obtained when the starting materials are diluted with an ether compound solvent.

The deposition condition of the lower ruthenium electrode 12 is not limited to the condition described above and may be same as the condition described in Embodiment 8.

Embodiment 12

Figure 15:
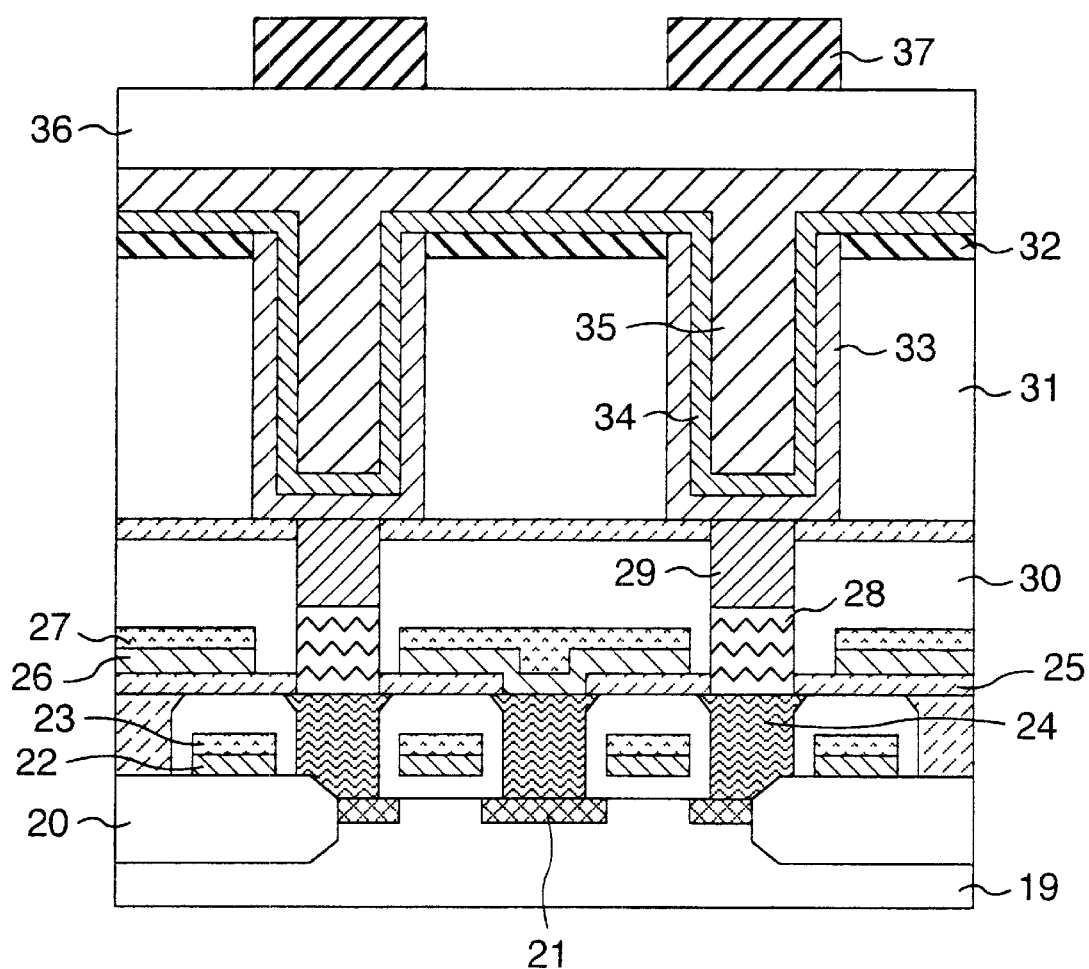
FIG. 15 is a sectional view of a semiconductor device useful for explaining Embodiment 12 of the present invention.

Embodiment 12 will be explained with reference to FIG. 15. This embodiment manufactures a capacitance storage device by the process described in Embodiment 1, for selectively depositing a Ru film of lower electrodes in the region where a TiN film as a deposition preventing film is not formed, and then rendering the TiN film of the deposition preventing film non-conductive to electrically isolate capacitors from one another.

Isolation regions 20 by thermal oxidation and diffusion layers 21 by ion implantation are formed on a Si substrate 19 and word lines comprising a laminate of poly-Si 22 and WSi 23 are formed over them. A laminate of bit lines comprising poly-Si 26 and $WSi_2$ 27 is then formed on the word lines. Plugs 24 made of poly-Si, plugs 28 made of TiN and plugs 29 made of Ru are formed between plug interlayer insulating films 30 made of $SiO_2$. This laminate plug electrically connects a diffusion layer 21 of a transistor to a lower electrode 33 of a capacitor. Subsequently, a capacitor interlayer insulating film 31 made of $SiO_2$, an isolation layer made of $TiO_2$, a lower electrode 33 made of Ru, a capacitance insulating film 34 made of BST and an upper electrode 35 made of Ru are formed by the process steps explained in Embodiment 1. An interlayer insulating film for interconnection 36 made of $SiO_2$ and a second wiring layer 37 made of W are formed over the upper part of the capacitors. It is confirmed that desired performance can be obtained when the memory operation of this capacitance storage device is confirmed.

Here, the steps of selectively depositing the lower ruthenium electrode by CVD in the region where the deposition preventing film is not formed and then rendering the deposition preventing film non-conductive to electrically isolate the capacitors as explained in Embodiment 1 are employed to form the capacitance storage device. Besides the process steps described above, it is also possible to employ the steps, explained in Embodiment 2, for selectively depositing the lower ruthenium electrode by CVD in the region where the deposition preventing film is not formed, and selectively removing the deposition preventing film to electrically isolate the capacitors. Desired memory operation performance can be obtained in this case, too.

Desired memory operation performance can also be obtained for the capacitance storage device fabricated by employing the steps, explained in Embodiment 3, for selectively depositing the lower ruthenium electrodes to the regions where the deposition preventing film is not formed, and then burying the holes to form the upstanding or pedestal-shaped lower electrodes.

Desired memory operation performance can also be obtained for the capacitance storage device fabricated by employing the steps, explained in Embodiment 4, for selectively depositing the ruthenium film by CVD in the region where the deposition preventing film is not formed to bury the holes and to form the plugs, and then rendering the deposition preventing film non-conductive to electrically isolate the capacitors from one another.

Desired memory operation performance can also be obtained for the capacitance storage device fabricated by employing the steps, explained in Embodiment 5, for selectively depositing the ruthenium film by CVD in the region where the deposition preventing film is not formed to bury the holes and to form the plugs, and then removing selectively the deposition preventing film to electrically isolate the plugs from one another.

Desired memory operation performance can also be obtained for the capacitance storage device fabricated by employing the step, explained in Embodiment 6, for selectively depositing the ruthenium film by CVD in the region where the Ru film is formed by sputtering, to bury the holes and to form the upstanding or pedestal-shaped lower electrodes.

Desired memory operation performance can also be obtained for the capacitance storage device fabricated by the step, explained in Embodiment 7, for selectively depositing the ruthenium film by CVD to bury the holes and to form the plugs.

Desired memory operation performance can also be obtained for the capacitance storage device fabricated by the step, explained in Embodiment 11, for selectively depositing the ruthenium film by CVD in the region where the Ru film is formed by sputtering, to form the concave, that is, thin film, lower electrodes.

Desired memory operation performance can also be obtained for the capacitance storage device fabricated by the step, explained in Embodiment 8, for selectively depositing the second ruthenium film by CVD in the region where the first ruthenium film is formed by CVD, to bury the holes and to form the upstanding or pedestal-shaped lower electrodes.

Desired memory operation performance can also be obtained for the capacitance storage device fabricated by the steps, explained in Embodiment 9, for selectively depositing the first ruthenium film by CVD and then selectively depositing the second ruthenium film by CVD to bury the holes and to form the upstanding or pedestal-shaped lower electrodes.

Desired memory operation performance can also be obtained for the capacitance storage device fabricated by the steps, explained in Embodiment 10, for forming the Ru film by sputtering on the oxide dielectric film and then depositing the ruthenium film by CVD on the region where the Ru film is formed, to form the upper electrodes.

As described above, the capacitors can be electrically isolated from one another in self-alignment in the capacitors used as the Ru lower electrode. Therefore, the step of processing the lower electrodes by the sputter-etching process can be omitted. The buried upstanding or pedestal-shaped lower electrode and plugs, and the upper electrodes can be formed more easily, too. It is therefore possible to accomplish a high integration density of a semiconductor capacitance device by fine etching, improvement of a yield by simplification of a process and reduction of a cost by reduction of number of steps.

What is claimed is:

1. A method of manufacturing a semiconductor device including a semiconductor substrate and a plurality of memory cells each having a capacitor formed with said semiconductor substrate, comprising the steps of:

forming a plurality of holes in an insulating film formed over said semiconductor substrate;

forming a film of a first conductive material by sputtering on said insulating film and on an inner surface and a bottom surface of each of said holes;

removing the film of said first conductive material from said insulating film, and leaving the film of said first conductive material on the inner surface and the bottom surface of said holes as a seed film;

burying said holes in said insulating film by the same material as said first conductive material by chemical vapor deposition by utilizing said seed film on the inner surface and the bottom surface of said holes, under a condition wherein deposition selectability is established to be large on said first conductive material, to be small on said insulating film;

removing said insulating film to expose said first conductive material buried, and forming a plurality of first electrodes isolated from one another; forming a dielectric film on said first electrodes at a predetermined temperature, a material of said first conductive material being Ru, Pt or Ir that does not lose conduction even when exposed to said predetermined temperature for forming said dielectric film; and forming a film of a second conductive material to serve as second electrodes on said dielectric film;

said first and second electrodes and said dielectric film together constituting said capacitors.

2. A method of manufacturing a semiconductor device according to claim 1, wherein formation of the film of said second conductive material comprises a step of forming a film of a third conductive material by sputtering on said dielectric film and a step of forming a film of a fourth conductive material by chemical vapor deposition on the film of said third conductive material.

3. A method of manufacturing a semiconductor device including a semiconductor substrate and a plurality of memory cells each having a capacitor formed with said semiconductor substrate, comprising the steps of:

forming a plurality of holes in an insulating material formed over said semiconductor substrate;

forming a film of a first conductive material on said insulating film and on an inner surface and a bottom surface of each of said holes by chemical vapor deposition;

removing the film of said first conductive material from said insulating film, and leaving the film of said first conductive material on the inner surface and the bottom surface of said holes as a seed film;

burying said holes in said insulating film by the same material as said first conductive material by chemical vapor deposition by utilizing said seed film on the inner surface and the bottom surface of said holes, under a condition wherein deposition selectability is established to be large on said first conductive material, to be small on said insulating film;

removing said insulating film to expose said first conductive material buried, and forming a plurality of first electrodes isolated from one another;

forming a dielectric film on said first electrodes at a predetermined temperature, said first conductive material being Ru, Pt or Ir that does not lose conduction even when exposed to said predetermined temperature for forming said dielectric film; and forming a film of a second conductive material to serve as a second electrodes on said dielectric film; said first and second electrodes and said dielectric film together constituting said capacitors.

4. A method of manufacturing a semiconductor device according to claim 3, wherein formation of the film of said second conductive material comprises a step of forming a film of a third conductive material by sputtering on said dielectric film and a step of forming a film of a fourth conductive material by chemical vapor deposition on the film of said third conductive material.

5. A method of manufacturing a semiconductor device including a semiconductor substrate and a plurality of memory cells each having a capacitor formed with said semiconductor substrate, comprising the steps of:

forming a deposition preventing film in an insulating film formed over said semiconductor substrate;

forming a plurality of holed in said insulating film in such a manner as to penetrate through said deposition preventing film;

forming a film of a first conductive material on an inner surface and a bottom surface of each of said holes by chemical vapor deposition by utilizing said deposition preventing film, under a condition wherein deposition selectability is established to be large on said insulating film, to be small on said deposition preventing film;

burying said holes in said insulating film by chemical vapor deposition by the same material as said first conductive material by utilizing a seed film on the inner surface and the bottom surface of said holes, under a condition wherein deposition selectability is established to be large on said first conductive material, to be small on said deposition preventing film;

removing said insulating film to expose said first conductor martial buried, and forming a plurality of first electrodes isolated from one another;

forming a dielectric film on said first electrodes at a predetermined temperature, a material of said first electrode being Ru, Pt or Ir that does not lose conduction even when exposed to said predetermined temperature for forming said dielectric film; and forming a film of a second conductive material to serve as second electrodes on said dielectric film;

said first and second electrodes and said dielectric film together constituting said capacitors.

6. A method of manufacturing a semiconductor device according to claim 3, wherein formation of the film of said second conductive material comprises a step of forming a film of a third conductive material by sputtering on said dielectric film and a step of forming a film of a fourth conductive material by chemical vapor deposition on the film of said third conductive material.

* * * * *